United States Patent [19]

Thorn et al.

[11] Patent Number: 5,690,805

[45] Date of Patent: *Nov. 25, 1997

[54] DIRECT METALLIZATION PROCESS

[75] Inventors: Charles Edwin Thorn, Newport, Ky.; Frank Polakovic, Ringwood, N.J.; Charles A. Mosolf, Juno Beach, Fla.

[73] Assignee: Electrochemicals Inc., Maple Plain, Minn.

[*] Notice: The term of this patent shall not extend beyond the expiration date of Pat. No. 5,476,580.

[21] Appl. No.: 471,871

[22] Filed: Jun. 7, 1995

Related U.S. Application Data

[63] Continuation-in-part of Ser. No. 340,849, Nov. 16, 1994, which is a continuation-in-part of Ser. No. 232,574, May 3, 1994, Pat. No. 5,476,580, which is a continuation-in-part of Ser. No. 62,943, May 17, 1993, Pat. No. 5,389,270.

[51] Int. Cl.$^6$ ............................. C25D 5/02; C25D 5/54; C25D 5/56; B05D 5/12
[52] U.S. Cl. ...................... 205/118; 205/125; 205/159; 205/162; 205/163; 205/164; 205/166; 205/183; 427/97; 216/18
[58] Field of Search ........................ 205/118, 125, 205/159, 162, 163, 164, 165, 166, 183; 427/97; 216/18

[56] References Cited

U.S. PATENT DOCUMENTS

| | | | |
|---|---|---|---|
| 409,096 | 8/1889 | Blank | 205/159 |
| 1,037,469 | 9/1912 | Goldberg | 427/123 |
| 2,176,879 | 10/1939 | Bartell | 44/9 |

(List continued on next page.)

FOREIGN PATENT DOCUMENTS

| | | |
|---|---|---|
| 2102240 | 10/1992 | Canada . |
| 0 085 413 | 8/1983 | European Pat. Off. . |
| 0 381 761 | 8/1990 | European Pat. Off. . |
| 60-110893 | 6/1985 | Japan . |
| 571435 | 9/1977 | U.S.S.R. . |
| 674981 | 7/1979 | U.S.S.R. . |
| 745964 | 7/1980 | U.S.S.R. . |
| 768793 | 11/1980 | U.S.S.R. . |
| 943333 | 7/1982 | U.S.S.R. . |
| 1176597 | 1/1970 | United Kingdom . |
| 1506464 | 4/1978 | United Kingdom . |
| 2177707 | 1/1987 | United Kingdom . |

OTHER PUBLICATIONS

Heats of Adsorption of Gold Chloride and Cyanide Complexes from Aqueous Solutions on Graphitized Carbon Black and a Coconut Active Carbon, Pergamon Press plc, Carbon vol. 29, No. 7, pp. 821–829, Groszek et al. (No month, 1991).

Preparation of Suspensions for Particle Size Analysis, Methodical Recommendations, Liquids and Dispersing Agents, Advances in Colloid and Interface Science, 29 (1988) 79–139, Bernhardt. (No month).

Studies of Graphitized Black After Contact with Aqueous Solution of Surfactant by the Method of Slow Neutron Scattering, Chemistry and Technology of Water, 1991 T. 13, No. 8 pp. 678–681, (No Translation) (Abstract only translated). (No month).

Aqualon, CMC Aqualon Sodium Carboxymethylcellulose, Physical and Chemical Properties. (Undated).

Aqualon, Klucel Hydroxypropylcellulose, Physical and Chemical Properties, Aqualon. (Undated).

Aqualon, Natrosol Hydroxyethylcellulose, A Nonionic Water–Soluble Polymer, Physical and Chemical Properties, Aqualon. (Undated).

Hercules, Hercules, Nitrocellulose, The First Thermoplastic Polymer Made From a Renewable Resource, Chemical and Physical Properties. Undated.

Hercules, Chemical and Physical Properties of Hercules Ethylcellulose, A Specialty Polymer With Broad Stability And Compatibility. Undated.

Dow Chemical Company, Methocel Cellulose Ethers, Binders and processing aids for ceramics. Feb. 1991.

Kelco, Technical Bulletin DB—1 5, 1991. (No month).

Rohm and Haas, Rohm and Haas Products for the Graphic Arts Industry, Acrysol I–545, Undated.

Rohm and Haas, Rohm and Haas Products For the Graphic Arts Industry, Acrysol I–1955, Rohm and Haas Comany, 1988. (No month).

Olin Hunt Specialty Products Inc. Operating Bulletin Rev. 1 (Jul. 1991), Olin Hunt, Blackhole Vertical Process.

Olin Hunt Specialty Products Inc. Operating Bulletin Rev. 1 (Jul. 1991), Olin Hunt, Blackhole Conveyor System Process II.

(List continued on next page.)

*Primary Examiner*—Kathryn L. Gorgos
*Assistant Examiner*—Edna Wong
*Attorney, Agent, or Firm*—McAndrews, Held & Malloy, Ltd.

[57] ABSTRACT

A method of applying a conductive carbon coating to a non-conductive layer, conductive carbon compositions, and a printed wiring board having through holes or other surfaces treated with such carbon compositions are disclosed. A board or other substrate including at least first and second electrically conductive metal layers separated by a non-conductive layer is provided. The board has a recess extending through at least one of the metal layers into the non-conductive layer. The recess has a non-conductive surface which is desired to be made electrically conductive. The carbon in the dispersion has a mean particle size no greater than about 50 microns. The method is carried out by applying the carbon dispersion to a non-conductive surface of the recess to form a substantially continuous, electrically conductive carbon coating. Optionally, the coating is then fixed, leaving the carbon deposit as a substantially continuous, electrically conductive layer. Chemical and physical fixing steps are disclosed. The resulting coating has a low electrical resistance and is tenacious enough to be plated and exposed to molten solder without creating voids or losing adhesion.

34 Claims, No Drawings

U.S. PATENT DOCUMENTS

| Patent # | Date | Inventor | Class |
|---|---|---|---|
| 2,243,429 | 5/1941 | Laux | 204/30 |
| 2,692,857 | 10/1954 | Michel et al. | 252/28 |
| 2,833,736 | 5/1958 | Glaser | 260/29.6 |
| 2,897,409 | 7/1959 | Gitto | 317/101 |
| 2,978,428 | 4/1961 | Aberegg | 260/29.6 |
| 2,983,220 | 5/1961 | Dalton et al. | 101/149.2 |
| 3,099,608 | 7/1963 | Radovsky et al. | 204/15 |
| 3,152,996 | 10/1964 | Forrester | 252/313 |
| 3,163,588 | 12/1964 | Shortt et al. | 204/16 |
| 3,249,559 | 5/1966 | Gallas | 252/510 |
| 3,495,962 | 2/1970 | Norton | 65/26 |
| 3,506,482 | 4/1970 | Hirohata et al. | 117/212 |
| 3,509,088 | 4/1970 | Dalton | 260/41 |
| 3,515,201 | 6/1970 | Zimmerman | 164/66 |
| 3,518,116 | 6/1970 | Stock et al. | 117/226 |
| 3,565,658 | 2/1971 | Frazier et al. | 106/307 |
| 3,578,577 | 5/1971 | Gilchrist | 204/181 |
| 3,639,121 | 2/1972 | York | 96/1.5 |
| 3,655,530 | 4/1972 | Taylor | 204/26 |
| 3,696,054 | 10/1972 | Saunders | 252/511 |
| 3,697,450 | 10/1972 | Takenaka et al. | 252/511 |
| 3,725,214 | 4/1973 | Bride | 204/15 |
| 3,764,280 | 10/1973 | Lupinski | 29/195 |
| 3,818,412 | 6/1974 | Deardurff | 338/214 |
| 3,852,131 | 12/1974 | Houston | 156/3 |
| 3,865,626 | 2/1975 | Diener et al. | 117/226 |
| 3,865,699 | 2/1975 | Luch | 204/20 |
| 3,870,987 | 3/1975 | Wiley et al. | 338/214 |
| 3,874,862 | 4/1975 | Bickling, Jr. et al. | 65/26 |
| 3,881,048 | 4/1975 | Bertrand | 428/447 |
| 3,966,581 | 6/1976 | Holte | 204/202 |
| 3,983,042 | 9/1976 | Jain et al. | 252/18 |
| 3,991,397 | 11/1976 | King | 338/214 |
| 4,000,046 | 12/1976 | Weaver | 204/38 R |
| 4,035,265 | 7/1977 | Saunders | 252/510 |
| 4,090,984 | 5/1978 | Lin et al. | 252/511 |
| 4,104,178 | 8/1978 | Jain et al. | 252/30 |
| 4,105,513 | 8/1978 | Nishino et al. | 204/38 A |
| 4,187,334 | 2/1980 | LaBate | 427/236 |
| 4,205,974 | 6/1980 | Franz | 65/40 |
| 4,213,870 | 7/1980 | Loran | 252/51.5 R |
| 4,239,794 | 12/1980 | Allard | 428/219 |
| 4,239,818 | 12/1980 | LaBate | 427/236 |
| 4,254,180 | 3/1981 | Kline | 428/323 |
| 4,278,511 | 7/1981 | Dugan | 204/15 |
| 4,316,831 | 2/1982 | LaBate | 260/29.6 S |
| 4,321,295 | 3/1982 | Smith-Johannsen | 428/206 |
| 4,368,252 | 1/1983 | Kakuhashi et al. | 430/312 |
| 4,389,278 | 6/1983 | Kai | 156/630 |
| 4,401,579 | 8/1983 | Kratzer | 252/17 |
| 4,416,790 | 11/1983 | Schürmann et al. | 252/62 |
| 4,424,930 | 1/1984 | Wilhelmson | 228/20 |
| 4,430,166 | 2/1984 | Carter | 204/15 |
| 4,465,565 | 8/1984 | Zanio | 204/56 R |
| 4,547,311 | 10/1985 | Sako et al. | 252/511 |
| 4,571,286 | 2/1986 | Penato | 204/15 |
| 4,581,301 | 4/1986 | Michaelson | 428/551 |
| 4,617,579 | 10/1986 | Sachdev et al. | 346/135.1 |
| 4,619,741 | 10/1986 | Minten et al. | 204/18 |
| 4,622,107 | 11/1986 | Piano | 204/15 |
| 4,622,108 | 11/1986 | Polakovic et al. | 204/15 |
| 4,629,537 | 12/1986 | Hsu | 204/15 |
| 4,631,117 | 12/1986 | Minten et al. | 204/15 |
| 4,683,036 | 7/1987 | Morrissey et al. | 204/15 |
| 4,684,560 | 8/1987 | Minten et al. | 428/131 |
| 4,691,091 | 9/1987 | Lyons et al. | 219/121 LM |
| 4,718,993 | 1/1988 | Cupta et al. | 204/15 |
| 4,724,005 | 2/1988 | Minten et al. | 106/307 |
| 4,735,676 | 4/1988 | Iwasa | 156/630 |
| 4,735,734 | 4/1988 | Staub et al. | 252/29 |
| 4,758,358 | 7/1988 | Lum et al. | 252/22 |
| 4,790,902 | 12/1988 | Wada et al. | 156/630 |
| 4,808,324 | 2/1989 | Périard et al. | 252/23 |
| 4,818,437 | 4/1989 | Wiley | 252/511 |
| 4,818,438 | 4/1989 | Wiley | 252/511 |
| 4,874,477 | 10/1989 | Pendleton | 204/15 |
| 4,879,015 | 11/1989 | Adamek et al. | 204/224 R |
| 4,889,750 | 12/1989 | Wiley | 428/34.2 |
| 4,897,164 | 1/1990 | Piano et al. | 204/15 |
| 4,911,796 | 3/1990 | Reed | 204/15 |
| 4,921,777 | 5/1990 | Fraenkel et al. | 430/314 |
| 4,935,109 | 6/1990 | Dugan | 204/15 |
| 4,964,948 | 10/1990 | Reed | 156/659.1 |
| 4,964,959 | 10/1990 | Nelsen et al. | 204/15 |
| 4,969,979 | 11/1990 | Appelt et al. | 204/15 |
| 4,980,202 | 12/1990 | Brennan et al. | 427/249 |
| 4,994,153 | 2/1991 | Piano et al. | 204/15 |
| 5,015,339 | 5/1991 | Pendleton | 204/15 |
| 5,024,735 | 6/1991 | Kadija | 204/15 |
| 5,030,367 | 7/1991 | Tanaka et al. | 252/22 |
| 5,032,235 | 7/1991 | Downing et al. | 204/15 |
| 5,041,242 | 8/1991 | Fowle et al. | 252/511 |
| 5,106,537 | 4/1992 | Nelsen et al. | 252/502 |
| 5,108,553 | 4/1992 | Foster et al. | 205/125 |
| 5,110,355 | 5/1992 | Pendleton | 106/1.11 |
| 5,139,642 | 8/1992 | Randolph et al. | 205/125 |
| 5,277,787 | 1/1994 | Otani et al. | 205/125 |
| 5,476,580 | 12/1995 | Thorn et al. | 205/122 |
| 5,500,106 | 3/1996 | Goldberg | 205/166 |

OTHER PUBLICATIONS

Chaurasia et al., J. Appl. Chem. Biotech. 1975, vol. 25, No. 12, 881–890, Thermal Conductivity of Supension and Emulsion Materials. (No month).

Printed Circuits Handbook, Chapter 13, Additive Plating, Dr. Hayao Nakahara, pp. 13.1–13.17. (Undated).

Kirk Othmer, vol. 1, pp. 298–302, 312–313, 330–333, 380–388, 394–396, 427, 430. (Undated).

Kirk Othmer, vol. 4, pp. 535–555, 556–558, 631–636. (Undated).

Kirk Othmer, vol. 9, pp. 267–272, 274–280, 286, 288. (Undated).

Kirk Othmer, vol. 20, pp. 197–198, 200–201, 207–227. (Undated).

Hoyu, Hair dyeing agent—contg. e.g. triphenlmethane agent and/or azo agent and/or quinoline agent and carbon block, Abstract No. JP 8870398, Mar. 24, 1988.

Necesany et al., Solid carbon recovery from aq. suspensions, Abstract No. CS 7807560, Sep. 15, 1980, (Abstract only).

Kadlec et al., Technically pure carbon prodn.—from heterogeneous mixtures contg., Abstract No. CS 7208325, Jun. 30, 1976. (Abstract only).

Mednikov et al., Forming aq. dispersions of carbon black using acrylic! or methacrylic! acid copolymer as dispersant to improve storability, Abstract SU 768793, Nov. 10, 1980.

Jara et al., Separation of carbon black from aqueous suspensions, Abstract No. 096226f, 60–Sewage, Wastes vol. 91, 1979, p. 299. (No month).

Takashina et al., Carbon black composition dispersible in water, Abstract No. 138303p, Chemical Abstracts, vol. 79, 1973, p. 60. (No month).

Shestakova et al., Effect of the salt composition of process water on pH of aqueous carbon black suspensions, Abstract No. 009722a, 61—Water, vol. 79, 1973, p. 307. (No month).

Moraru et al., Adsoprtion of exeythylated nonionic surfactants and its effect on the stability of aqueous dispersions of graphite, Abstract No. 084887e, 66–Surface Chem., Colloids, vol. 102, 1985, p. 397. (No month).

No–Author, Thermally–expanded graphite for addition to coatings, JP 02/153811, 1990. (No month).

Chiyoda et al., Coating composition based on graphite for the interior wall of a picture tube, Abstract No. CA 94(24):201807h CA, Apr. 9, 1981.

Suzuki, Formation of conductive coated film, Abstract No. JP 61/161181, Jul. 21, 1986.

Adachi et al., Production of electrically–conductive graphite material, Abstract No. JP 61/127612, Jun. 14, 1986 (Abstract only).

Ozaki et al., Conductive water–disperse coating, Abstract No. JP 60/156769, Aug. 16, 1985.

Deyama, Water–resistant, electrically conductie paint, Abstract No. JP 58/194962, Nov. 14, 1983.

Sako et al., Electrically conductive paint composition, Abstract No. JP 58/132058, Aug. 6, 1983.

Yoshimura et al., Electrically conductive coating composition, Abstract No. JP 58/025368, Feb. 15, 1983.

Derwent World Pat., Aq. graphite–water glass dispersion coating matl.—for forming black matrix layer on the image surface of colour tubes, Abstract: JP 76/005856, Feb. 23, 1976.

Juracka et al., Compositiog for formation of electrically conductive or semiconductive coatings, Abstract: CA112(20):190074d (Abstract only). (Undated).

Bauer et al., Stable aq. very fine graphite past prodn. from graphite powder—by dispersing in water contg. surfactant and ammonia, dilution, sepn, and concn., Abstract No. DD 294589. Oct. 2, 1991.

Lubricant composn. for high temps.—contains powdered graphite, water, and as binder, water–soluble polymer and water–dispersible polymer, Abstract No. JP 2051592. Jan. 21, 1990.

Akhremenko et al., Lubricant for roller–lesss conveyor belt moving in groove—contains graphite, forming agent, and additional alkali salts of higher fatty acids, to stabilise lubricating properties, Abstract No. SU 1498786. Aug. 7, 1989.

Sokirko et al., Lubricant for hot pressure forming of metals—contains graphite, fireclay, additional synthetic detergent, and water, Abstract No. Su 1579929. Jul. 23, 1990.

Water–colloidal grpahite disperse systems, Sandu, et al., Abstract: CA106(16):126512u. Undated.

Dow Chemical Co., *Selecting The Best Versene Chelating Agent*, (undated).

Sandoz Chemicals, *Water Soluble Polymers*, (undated).

Exxon Chemical, *Callaway 6818*, May 30, 1991.

JP Kokai No. 52–87694, Jul. 21, 1977.

JP Kokai No. 58–138795, Aug. 17, 1983.

JP Kokai No. 61–51097, Mar. 13, 1986.

JP Kokai No. 63–125580, May 28, 1988.

JP Kokai No. 1–219170, Sep. 1, 1989.

JP Kokai No. 2–151682, Jun. 11, 1990.

JP Kokai No. 2–258897, Oct. 19, 1990.

JP Kokai No. Hei 3–207890, Sep. 11, 1991.

Adsorption of Oxy–Ethylated Nonionic Surfactants and Its Influence on the Stability of the Aqueous Dispersions of Graphite, 7 Colloid Journal, No. 6, pp. 1148–1153, Moraru et al. (abstract only translated). (Undated).

Adsorption of Phenol on Surface–modified Carbon Black from Its Aqueous Solution. II. Influence of Surface–Chemical Structure of Carbon on Adsorption of Phenol[1], 1985 The Chemical Society of Japan, Bull. Chem. Soc. Jpn., 58, 2009–20014, Asakawa et al. (No month).

3M Industrial Chemical Products Division, *Fluorad Fluorochemical Surfactant FC–120*, Mar. 1992.

Van Deraerschot, Separation of carbon black from aqueous suspensions, Abstract No. 91:76784h, Chemical abstracts, vol. 91, 1979, p. 134. May 3, 1979.

JP Koaki No. 60–155280, Aug. 15, 1985.

JP Kokai No. 49–36429, Apr. 4, 1974.

JP Kokai No. 59–223769, Dec. 15, 1984.

JP Kokai No. Hei 4–332774, Nov. 19, 1992.

JP Kokai No. Hei 2–258897, Oct. 19, 1990.

Metal Lub. Grafo 1204B Interim Data Sheet (undated).

Grafo, Bulletin, Dispersions Of Graphite And Other Solids For Industrial Coating Applications. (undated).

Honda, Motor Co., Coating materials for metal melt–casting molds, CA102(20):171023P, Dec. 27, 1984.

Ryzhkov, et al., Parting coating, CA81(20):125232f, Dec. 1, 1971.

Electric mass transfer of dispersed conducting carbon black–polyethylene compositions during electrostatic fluidized–bed deposition, Abstract No. CA112(16):141269, 1989 (Abstract only). (No month).

No Author, Electrically conductive coating composition, Abstract EP085413, (undated).

DIRECT METALLIZATION PROCESS

CROSS-REFERENCE TO RELATED APPLICATION

This is a continuation-in-part of U.S. Ser. No. 08/340,849, filed Nov. 16, 1994, which is a continuation-in-part of U.S. Ser. No. 08/232,574, filed May 3, 1994, now U.S. Pat. No. 5,476,580, which in turn is a continuation-in-part of U.S. Ser. No. 08/062,943, filed May 17, 1993, now U.S. Pat. No. 5,389,270. The entire specification and all the claims of each prior application referred to above are hereby incorporated by reference to provide continuity of disclosure.

TECHNICAL FIELD

The present invention is directed to printed wiring boards having through holes, or other substrates, made electrically conductive by applying a coating containing carbon to the initially nonconductive through hole or other substrate.

BACKGROUND ART

Printed circuit boards are formed from a layer of conductive material (commonly, copper or copper plated with solder or gold) carried on a substrate of insulating material (commonly glass-fiber-reinforced epoxy resin). A printed circuit board having two conductive surfaces positioned on opposite sides of a single insulating layer is known as a "double-sided circuit board." To accommodate even more circuits on a single board, several copper layers are sandwiched between boards or other layers of insulating material to produce a multilayer circuit board.

To make electrical connections between two or more circuit layers on opposite sides of a double-sided circuit board, a hole is first drilled through the two conducting circuit layers and the insulator board. These holes are known in the art as "through holes," particularly if they extend through the entire circuit board. Through holes are typically from about 0.05 mm to about 5 mm in diameter and from about 0.025 mm to about 6 mm. long. The through hole initially has a nonconductive cylindrical bore communicating between the two conductive surfaces. A conductive material or element is positioned in the through hole and electrically connected with the conducting sheets or layers to complete an electrical connection.

Like double-sided circuit boards, multilayer circuit boards also use holes in an intervening insulating layer to complete circuits between the circuit patterns on opposite sides of the insulating layer, as well as intermediate layers. Unless the context indicates otherwise, references in this specification to "through holes" refer to these holes in multilayer boards as well, even if they do not literally go through the entire circuit board.

Various conductive elements have been devised over the years for forming a conductive pathway via the through hole. Initially, conductive solid parts (e.g., rivets or eyelets) were inserted through the through holes and mechanically secured in place. However, these parts were labor intensive to install and proved unreliable with age. Jumper wires running around the edge of or through the board and the leads of conductive elements soldered to the board have also been used.

More recently, conductive material—typically, a layer of copper—has been coated on the nonconductive through hole bore to provide a cylindrical bridge between the conducting sheets which lie at the opposite ends of the through hole. Electroplating is a desirable method of depositing copper and other conductive metals on a surface, but electroplating cannot be used to coat a nonconductive surface, such as an untreated through hole. It has thus been necessary to treat the through hole with a conductive material to make it amenable to electroplating.

One process for making the through hole bores electrically conductive, to enable electroplating, is to physically coat them with a conductive film. The coated through holes are conductive enough to electroplate, but typically are not conductive and sturdy enough to form the permanent electrical connection between the conductive layers at either end of the through hole. The coated through holes are then electroplated to provide a permanent connection. Electroplating lowers the resistance of the through hole bore to a negligible level which will not consume an appreciable amount of power or alter circuit characteristics.

Conductive through hole coating compositions containing nonmetallic, electrically conductive particles have long been sought to avoid the expense and disposal problems associated with metal deposition. The only common nonmetallic conductors are graphite and carbon black. Of these two, graphite is far more conductive, so the art has long sought to make a graphite dispersion which is suitable for coating a through hole with a conductive layer of graphite. Graphite dispersions, however, were previously regarded as unsuitable for preparing through holes for electroplating.

U.S. Pat. No. 3,163,588 (Shortt), which issued on Dec. 29, 1964, briefly suggests that a through hole surface may be rendered conductive prior to electroplating by applying a paint or ink containing a substance such as graphite. Col. 3, ln. 57–58.

U.S. Pat. No. 3,099,605 (Radovsky), which issued on Jul. 30, 1963, states, however, that the prior use of graphite to form a conductive base coating on the exposed areas of a through hole suffered from many "defects." Col. 1, ln. 66. These defects were said to include the "lack of control of the graphite application with the resultant poor deposit of the electroplated metal and non-uniform through hole diameters." Col. 1, ln. 66–70.

U.S. Pat. No. 4,619,741 (Minten) teaches that "when graphite particles are used ... loss of adhesion of the copper to the non-conducting material after the subsequent electroplating was noted." Col. 7, ln. 11–16. In comparison 1 of the '741 patent, through holes that were electroplated after application of the first substitute graphite formulation (2.5% by weight graphite) had only a few visible voids, "but failed the solder shock test." Col. 20, ln. 5–7. According to the '741 patent, "[t]he plated on copper in the holes pulled away from the epoxy/glass fiber layer." Col. 20, ln. 7–8. The results were even worse with the second substitute graphite formulation (0.5% by weight graphite). After electroplating, the boards that were treated with the second substitute formulation had voided holes. See: col. 20, ln. 14. According to the '741 patent, "[t]he standard shock test could not be run on boards that were prepared with this latter graphite formulation because of the lack of unvoided holes." Col. 20, ln. 14–16.

U.S. Pat. No. 5,139,642 (Randolph), which issued on Aug. 18, 1992, contains comparative examples 3A and 3B in which a graphite dispersion was coated in a single pass on a through hole and dried to form a graphite layer directly on the nonconductive substrate. The substrate was then subjected to a through hole electroplating process. The test was a failure: the patent states that "[t]his board (C-3B) was not evaluated for adhesion since significant voids were observed even after 55 mins. of plating."

A competing process for plating through holes has been to use electroless copper—a solution which plates metal through chemical action, requiring no electricity, and which thus will deposit conductive metal on a nonconductive substrate. Electroless copper can plate copper directly on the through hole to make it conductive. Then, typically, electroplating is used to build up the coating, providing a permanent conductive path.

U.S. Pat. No. 4,619,741 (Minten), which issued on Nov. 11, 1986, teaches that, since about 1961, the industry had relied upon electroless copper deposition to prepare the walls of a through hole for electroplating. Col. 1, ln. 25–28. Although electroless deposition provided superior results to the prior art methods for preparing a through hole surface, electroless deposition has several commercial disadvantages. As pointed out by Minten, these disadvantages include a six step process prior to electroplating; a long process time; multiple treatment baths; a "complex chemistry which may require constant monitoring and individual ingredients which may require separate replenishment; " a "palladium/ tin activator [which] also may require extensive waste treatment; " and a "multiplicity of rinse baths [which] may require large amounts of water." Col. 1, ln. 66, to col. 2, ln. 7.

Radovsky, cited previously, nonetheless states that the electroless plating method "has advantages over the graphite methods." Col. 2, ln. 10–12. "[The] advantages are essentially better control over the base layer of catalyst metal deposition and a resultant improved electroplating process with more uniform hole diameters." Col. 2, ln. 12–15.

To overcome the disadvantages associated with the electroless and graphite deposition methods, U.S. Pat. No. 4,619,741 (Minten), cited above, teaches coating the non-conductive surface of a through hole wall of a printed circuit board with carbon black particles prior to electroplating. The '741 patent expressly teaches that "graphite particles" are not capable of substituting for the carbon black particles. According to the '741 patent, "both graphite formulations were far inferior for electroplating preparation as compared to the above carbon black formulations." Col. 20, ln. 17–19.

The following U.S. patents also teach that graphite is not a substitute for carbon black in carbon black formulations for making through holes conductive prior to electroplating: U.S. Pat. No. 4,622,108 (Polakovic: one of the present inventors) at col. 8, ln. 1–5; U.S. Pat. No. 4,631,117 (Minten) at col. 7, ln. 24–28 ("when graphite particles are used as a replacement for the carbon black particles of this invention, the undesirable plating characteristics mentioned in U.S. Pat. No. 3,099,608 would likely occur"); U.S. Pat. No. 4,718,993 (Cupta) at col. 8, ln. 27–37; and U.S. Pat. No. 4,874,477 (Pendleton) at col. 7, ln. 60–68.

In addition, the following U.S. patents discuss the deficiencies associated with using graphite as a conductive coating prior to electroplating: U.S. Pat. No. 4,619,741 at col. 2, ln. 16–25; U.S. Pat. No. 4,622,108 at col. 2, ln. 12–20; U.S. Pat. No. 4,622,107 at col. 1, ln. 52–60; U.S. Pat. No. 4,631,117 at col. 2, ln. 22–30; U.S. Pat. No. 4,718,993 at col. 2, ln. 21–29; U.S. Pat. No. 4,874,477 at col. 1, ln. 54–62; U.S. Pat. No. 4,897,164 at col. 1, ln. 54–62; U.S. Pat. No. 4,964,959 at col. 1, ln. 28–36; U.S. Pat. No. 5,015,339 at col. 1, ln. 56–64; U.S. Pat. No. 5,106,537 at col. 1, ln. 34–42; and U.S. Pat. No. 5,110,355 at col. 1, ln. 60–68. According to these patents, the deficiencies with the graphite process included lack of control of the graphite application, poor deposit of the resultant electroplated metal, non-uniform through hole diameters, and high electrical resistance of the graphite.

A carbon black process is commercially available under the BLACKHOLE trademark from MacDermid Incorporated of Waterbury, Conn. It is difficult to make the BLACKHOLE process work, however, and it provides a coating with an undesirably high electrical resistance. All the current used for electroplating must flow through the carbon black coating, so, for a given voltage, the current flow through a high resistance coating is relatively low. The rate of electroplating is proportional to the current flow, so a high resistance coating requires a long plating time to plate the desired quantity of metal over the carbon black coating. The voltage drop across the high resistance coating also consumes electricity by generating heat.

The electrical resistivity problem with the carbon black process has been addressed commercially in the BLACKHOLE process by depositing a second coat of carbon black over the first to further lower the resistivity of the coating. Of course, this two-pass process requires more materials, time, and equipment than a one-pass process.

The Randolph patent cited previously teaches that the deficiencies of a single graphite layer or a single carbon black layer can be avoided by applying an aqueous dispersion of carbon black directly to the through hole, removing the water to leave a carbon black film, then applying an aqueous dispersion of graphite to the carbon black film, and finally removing the water to form a second, graphite film. The carbon black film acts as a primer or adhesion promoter for the graphite film to increase adhesion, while the graphite layer is more electrically conductive and thus lowers the resistivity of the composite coating. But a two-pass process is again required.

SUMMARY OF THE INVENTION

Accordingly, an object of the present invention is to deposit a controlled and uniform coating of graphite or carbon black (which are referred to in this specification either together or separately as "carbon") particles on the non-conductive surface of a through hole. As used herein, a "uniform" coating is one essentially free of excess conductive coating composition build up, particularly at the ends of the through hole, so the coating has a substantially uniform thickness at the mouth and in the interior of the hole, as viewed under a 50× magnification of a cross-section of a through hole after plating.

Another object of the present invention is to uniformly deposit a particulate carbon coating which is adequate to eliminate the need for electroless plating prior to electroplating.

An additional object of the invention is to provide a conductive coating with good adhesion to a nonconductive substrate, for example, a coating which adheres to a through hole wall better than coatings of palladium, electroless copper, carbon black, or graphite provided by prior through hole coating process and compositions.

Still another object of the present invention is to provide an electroplated conductive through hole coating which is capable of withstanding the solder shock test.

A still further object of the invention is to provide a conductive carbon coating with a low resistivity.

Yet another object of the invention is to provide a particulate coating which can provide lower resistivity in a one-pass process than has previously been possible.

Other objects of the invention will become apparent to one skilled in the art who has the benefit of this specification and the prior art.

One aspect of the present invention, which meets one or more of the above objects, is a method of applying a conductive graphite coating to a non-conductive layer. This method includes the following steps.

A board or other substrate including at least first and second electrically conductive metal layers separated by a non-conductive layer is provided. The board has a recess extending through at least one of the metal layers into the non-conductive layer. The recess has a non-conductive surface which is desired to be made electrically conductive.

A liquid dispersion of electrically conductive graphite is also provided. The graphite in the dispersion has a mean particle size no greater than about 50 microns. The graphite is present in an amount effective to provide an electrically conductive coating when the composition is applied to a non-conductive surface of the recess.

The method is carried out by applying the graphite dispersion to a non-conductive surface of the recess to form a substantially continuous, electrically conductive graphite coating. This coating has a low electrical resistance and is tenacious enough to be plated and exposed to molten solder without creating voids or losing adhesion.

Another aspect of the invention is a method for rendering a non-conductive surface electrically conductive, using a carbon dispersion. This method also includes several steps.

A liquid dispersion of electrically conductive carbon is provided. The carbon particles have a mean particle size not greater than about 50 microns.

The carbon dispersion is applied to a non-conductive surface to form a coating. The carbon particles are present in the composition in an amount effective to leave an electrically conductive coating on the substrate after the composition is applied.

The coating is then fixed, leaving the carbon deposit as a substantially continuous, electrically conductive layer. Fixing may be accomplished in at least two different ways, referred to here as the chemical fixing method and the physical fixing method and further defined below.

DETAILED DESCRIPTION OF THE INVENTION

While the invention will be described in connection with one or more preferred embodiments, it will be understood that the invention is not limited to those embodiments. On the contrary, the invention includes all alternatives, modifications, and equivalents as may be included within the spirit and scope of the appended claims.

The present invention is carried out by providing and using a conductive carbon dispersion as described in the Description of the Invention section above. A detailed description of the ingredients of the dispersion and how it is made and used follows.

Carbon

One component of the present conductive compositions is electrically conductive carbon, for example, carbon black, graphite, or combinations of the two. Graphite is different from carbon black. Carbon black particles are amorphous. In contrast, graphite particles are highly crystalline. Typically, carbon black particles are impure, frequently being associated with 1–10% volatiles. See U.S. Pat. No. 4,619,741 at col. 7, ln. 5–11. In contrast, graphite is relatively pure, particularly synthetic graphite.

The electrically conductive carbon particles should be present in an amount effective to provide an electrically conductive coating when the composition is applied to a substrate. The carbon may be present as from about 0.1 to about 20% by weight, alternatively from about 0.5 to about 10% by weight, alternatively from about 1% to about 7% by weight, alternatively from greater than about 4% to about 6.5% by weight of the composition.

The carbon may have a mean particle size within the range from about 0.05 to about 50 microns, alternatively from about 0.3 to 1.0 microns, alternatively from about 0.7 to about 1.0 microns. From the perspective of performance and ease of dispersion, particles from the smaller end of the size range are preferred. However, the smaller particles, particularly graphite particles, are more costly. Graphite particles of suitable size can be prepared by the wet grinding or milling of raw graphite, having a particle size greater than 50 microns, to form a slurry of smaller particles. Graphite particles of suitable size can also be formed by graphitizing already-small carbon-containing particles.

The inventors have found it unnecessary to obtain graphite having mean particle sizes substantially less than one micron, contrary to the conventional belief that extremely fine graphite is necessary.

If both carbon black and graphite are used, the carbon black may have a substantially smaller particle size (for example, a sub-micron average diameter) than the graphite (for example, an about one micron or greater number-average diameter). The ratio of graphite to carbon black may be at least about 1:100, or at least about 1:10, or at least about 1:3, or at least about 1:1, or at least about 3:1, or at least about 6:1, or at least about 10:1, or at least about 20:1, or at least about 50:1, or at least about 100:1, or at most about 1:100, or at most about 1:10, or at most about 1:3, or at most about 1:1, or at most about 3:1, or at most about 6:1, or at most about 10:1, or at most about 20:1, or at most about 50:1, or at most about 100:1, each ratio being a weight-weight ratio.

While not bound by any theory as to why the admixture of carbon black and graphite may be desirable, the inventors submit that graphite and carbon black may be synergistic in the contemplated coating compositions because graphite is more conductive but hard to grind to sub-micron size, while carbon black is normally sub-micron-sized but less conductive. The smaller carbon black particles may lodge and form low-resistance paths in the interstices between the larger graphite particles, thus reducing the interstitial electrical resistance of the coating.

The carbon black useful herein can be substantially as described in U.S. Pat. No. 5,139,642. The carbon black description of that patent is hereby incorporated herein by reference in its entirety. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein can be substantially as described in U.S. Pat. No. 5,139,642. The graphite description of that patent is hereby incorporated herein by reference in its entirety. In the present compositions, the graphite may be either synthetic or naturally occurring. Accordingly, suitable commercial graphite and graphite dispersions contemplated to be useful herein include: ULTRAFINE GRAPHITE, sold by Showa Denko K.K., Tokyo, Japan; AQUADAGE E; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics.

However, synthetic graphite is preferred. Synthetic graphite is formed by heat treating (graphitizing) a carbon source at temperatures exceeding 2400° C. The most conductive and most preferred graphite (electronic grade) is prepared at very high graphitization temperatures (such as about 3000° Kelvin).

In the present compositions, the conductivity of the carbon is important. When carbon is deposited on the non-conductive surface of a through hole, it is both the conductivity of the carbon particles and their uniform deposition which enable the carbon deposit, as a whole, to act as a cathode and to receive uniformly electroplated conductive metal layer.

While the inventors presently prefer graphite dispersions, the present invention can also be carried out using carbon black dispersions.

Aqueous dispersions of carbon black or graphite are well known in the art and in related arts, such as lubricating compositions and conductive coatings for other purposes.

Binding Agent

Another component of some of the present compositions is a water soluble or dispersible binding agent for binding the carbon particles. The binding agent is believed to assist the dispersed carbon particles in adhering to the surface of the non-conductive (i.e., dielectric) substrate which is to be made conductive for electroplating. The binding agent should be present in an amount effective to bind the carbon particles to a substrate. The binding agent may be present as from about 0% to about 15% by weight, or from about 0.2 to about 10% by weight, or from about 0.5% to about 6% by weight, or from about 1.5% to about 3% by weight, of the composition for binding to the carbon particles.

The binding agent is preferably any natural or synthetic polymer, polymerizable monomer, or other viscous or solid material (or precursor thereof) that is capable of both adhering to the carbon particles and of receiving an anionic dispersing agent (as described below). Alternatively, the binding agent can be capable of dispersing the carbon particles to which it adheres in the aqueous medium of the dispersion. For example, the binding agent may be a water soluble or water dispersible material selected from the group consisting of mono- and polysaccharides (or, more broadly, carbohydrates) and anionic polymers. Typically, for purposes of this invention, a 2% by weight aqueous test solution of the binding agent will have a viscosity within the range of 25–800 cps at 25° C., although other concentrations of the binding agent and other viscosities of the complete through hole coating composition are also contemplated herein.

Monosaccharide binding agents contemplated for use herein include tetroses, pentoses, and hexoses. Polysaccharide (which for the present purposes includes disaccharide and higher saccharide) binding agents contemplate for use herein include sucrose (from beets, sugarcane, or other sources), maltose, fructose, lactose, stachyose, maltopentose, dextrin, cellulose, corn starch, other starches, and polysaccharide gums. Polysaccharide gums contemplated for use herein include agar, arabic, xanthan (for example, KELZAN industrial grade xanthan gum, available from the Kelco Div. of Merck & Co. Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemicellulose polysaccharides contemplated for use herein include d-gluco-d-mannans, d-galacto-d-gluco-d-mannans, and others. Anionic polymers contemplated herein include the alkylcelluloses or carboxyalkylcelluloses, their low- and medium-viscosity alkali metal salts (e.g. sodium carboxymethylcellulose, or "CMC"), cellulose ethers, and nitrocellulose. Examples of such anionic polymers include KLUCEL hydroxypropylcellulose; AQUALON CMC 7L sodium carboxymethylcellulose, and NATROSOL hydroxyethylcellulose, which are all commercially available from Aqualon Company of Hopewell, Va.; ethylcellulose, available from Hercules of Wilmington, Del.; METHOCEL cellulose ethers, available from Dow Chemical Co., Midland, Mich.; and nitrocellulose, which is also available from Hercules.

The acrylics contemplated herein for use as binding agents include polymerizable monomers and polymers, for example, emulsion polymers commonly known as acrylic latices. The monomers include acrylamide, acrylonitrile, acrylic acid, methacrylic acid, glycidyl methacrylate, and others. The acrylic polymers include polymers of any one or more of the foregoing monomers; polyacrylamide polymers such as SEPARAN NP10, SEPARANMGL, SEPARAN 870, and SEPARAN MG200 polymers; polyacrylic acid; acrylic ester polymers such as polymethyl acrylate, polyethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates. Suitable acrylics available to the trade include NALCO 603, PURIFLOC C31, and ACRYSOL acrylics sold by Rohm and Haas Company of Philadelphia, Pa.

Other binding agents are also contemplated herein. The vinyl resins contemplated herein include polyvinyl acetates, polyvinyl ethers, and polyvinyl chlorides. The pyrrolidinone resins contemplated herein include poly(N-vinyl-2-pyrrolidinone). Representative trade materials of this kind are PVP K-60 resin, PVP/VA E335 resin, PVP/VA 1535 resin, and other resins sold by GAF Corporation. The polyols contemplated herein include polyvinyl alcohols. The polyvinyl alcohols contemplated herein include ELVANOL 90-50, ELVANOL HV, ELVANOL 85-80, and others.

Cationic resins and other materials contemplated for use herein as binding agents include polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols are also contemplated for use as binding agents. Polyethylene oxides, such as materials available under the trade names NSR N-10, NSR N3000, and NSR 301 from Union Carbide Corp., are contemplated herein.

Still more binding agents contemplated herein include epoxy resins, cresol novolac resins, phenol novolac resins; epichlorohydrin resins; bisphenol resins; phenolic resins, such as DURITE AL-5801A resin available from Borden Packaging and Industrial Products of Louisville, Ky.; and natural resins and polymerizable materials such as damar, manila, rosin gum, rosin wood, rosin tall oil, and others.

A practical upper limit to the amount of binding agents used is contemplated to be that amount which materially interferes with the conductivity of the resulting conductive coatings by diluting the conductive solids in the composition after it is deposited as a film.

Dispersing Agent

Another component of some of the present compositions is an anionic dispersing agent. The anionic dispersing agent has a molecular weight less than about 1000 Daltons, so it is a substantially smaller molecule than the binding agent.

The anionic dispersing agent has a hydrophobic end and a hydrophilic (anionic) end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus, to disperse.

The amount of anionic dispersing agent that is contemplated for the purposes of the present invention is an amount sufficient to cause the bound carbon particles to disperse in the aqueous dispersing medium. The amount of dispersing agent that is used is dependent upon the size of the carbon particle and the amount of binding agent bound thereto. As a general rule, smaller carbon particles require less dispersing agent than would be required to disperse larger particles.

To determine the amount of dispersing agent that is required in any particular case, one of ordinary skill in the art can begin by adding ever increasing amounts of dispersing agent to the bound carbon particles until a sufficient amount is added to cause the particles to disperse. This amount of dispersing agent is the minimum effective amount of dispersing agent. Increasing amounts of dispersing agent could be added without adversely affecting the dispersion of the carbon particles. To ensure that the particles remain dispersed, one could add a ten percent greater amount of dispersing agent than is needed.

Thus, for purposes of the present invention, the amount of anionic dispersing agent that is used in the composition of the present invention is contemplated to be an amount that is effective for dispersing the bound carbon particles. For example, the anionic dispersing agent may be present as from about 0% to about 10% by weight, alternatively from about 0.01% to about 5% by weight, alternatively from about 0.1% to about 2% by weight of the composition. A practical upper limit to the amount of anionic dispersing agents used is contemplated to be that amount which materially interferes with the conductivity of the resulting conductive coatings by diluting the conductive solids in the composition after it is deposited as a film.

Suitable anionic dispersing agents include acrylic latices, aqueous solutions of alkali metal polyacrylates, and similar materials. Some of the previously defined binding agents of the present invention which have an anionic character are also contemplated to be suitable as the anionic dispersing agent herein.

Specific dispersing agents contemplated herein include ACRYSOL I-1955 and ACRYSOL I-545 dispersing agents, both of which are commercially available from the Robam and Haas Co., Philadelphia, Pa. The ACRYSOL dispersing agents may be used alone or together, preferably together. A preferred weight ratio of ACRYSOL I-1955 to ACRYSOL I-545 is about I-1:4.

Buffers

The composition and method of the present invention is capable of being run over a wide pH range. Most broadly, the dispersion may have any pH which does not entirely destroy its utility for carrying out any mode of the present invention. Alternatively, the present composition may have a pH within the range of from about 4 to about 14. An alternative pH range is from about 9 to about 11, another is from about 9.5 to about 10.5, and still another is from about 10.7 to about 11.

The pH of the dispersion may be maintained by employing a pH buffer. The buffer functions by precluding or minimizing changes in pH such as may occur during the course of a run as a large number of boards are treated with the composition of the present invention. The maintenance of a constant or nearly constant pH ensures that the conductive coating is applied reproducibly from board to board. Another advantage of using a buffer system is that the normalities of one or more buffer components can be measured and adjusted to maintain proper process control.

A pH in the preferred range can be provided by adding a carbonate-bicarbonate buffer to the conductive composition. The use of other pH buffering systems, such as phosphate, acetate, borate, barbital, and the like, are well known in the art. The anions of the buffer may be associated with any suitable cation, such as an alkali metal cation, such as sodium, potassium, or lithium; or an ammonium cation.

Surfactants

An optional component of some of the compositions of the present invention is a surfactant. One function of the surfactant is to decrease the surface tension of the aqueous dispersing medium, so the aqueous dispersing medium containing the dispersed carbon particles is able to freely penetrate into the through holes. A second function of the surfactant is to wet the surfaces of the polymeric and glass substrates. This facilitates the coating of these surfaces with the carbon dispersion.

The amount of surfactant that is used in any particular case will vary depending upon the surfactant itself. To determine the amount of surfactant that is required in any particular case, one can begin by adding about 0.1% by weight surfactant to the composition and increasing the amount until the desired performance is achieved. Although additional amounts of surfactant could be added, they might not provide any additional benefit.

The diameters of the through holes are typically within the range of 0.05 mm to 5 mm. With through hole sizes within the range of 4–5 mm, a surfactant may not be necessary. However, with through hole sizes below about 4 mm, an increasing amount of surfactant is recommended with decreasing through hole sizes. The circuit boards may vary in thickness (and thus their through holes may vary in length) from that of a double-sided circuit board to a multilayer circuit board having up to twenty-four layers. Thus, when needed, the composition of the present invention should contain sufficient surfactant to allow the aqueous dispersing medium to freely carry the dispersed carbon particles through the through holes in circuit boards having through holes of various sizes.

The composition typically contains from about 0.01% to about 10% by weight, or from about 0.02% to about 3% by weight, or from about 0.05% to about 1% by weight of the composition, of the surfactant.

Suitable surfactants for use in the present invention include TRITON X-100, sold by Rohm and Haas Co., Philadelphia, Pa.; MAPHOS 56, sold by Mazer Chemicals, Inc.; TAMOL 819L-43, 850, and 960 anionic surfactants, available from Rohmand Haas Co., Philadelphia, Pa.; FLUORAD® FC-120, FC-430, FC-431, FC-129, and FC-135 anionic fluorochemical surfactants; sold by Minnesota Mining & Manufacturing Co., St. Paul, Minn.; DARVAN No. 1, sold by R. T. Vanderbilt Co.; ECCOWET LF, sold by Eastern Color and Chemical; PETROULF, sold by Petro Chemical Co. Inc.; POLYTERGENT B-SERIES surfactant, sold by Olin Corporation; and others. Cationic and other surfactants may also be used, depending upon the pH and other characteristics of the composition.

Other surfactants contemplated to be suitable for use herein include DM-5, M-5, and M-10 polymeric dispersants or Colloid 211, 225, and 233 surfactants, sold by Rhone-Poulenc, Cranbury, N.J.; SURFINOL CT-136 and CT-141 surfactants, sold by Air Products and Chemicals, Inc., Allentown, Pa.; GRADOL 300 and 250 and HA and HAROL D surfactants, sold by Graden Chemicals Co. Inc., Hayertown, Pa.; AEROSOL NS and OT-B surfactants, sold by American Cyanamid Co., Wayne, N.J.; and LIGNASOL B and BD, MARASPERSE N-22, and CBOS-3 and C-21 surfactants sold by Dashowa Chemicals Inc., Greenwich, Conn.

Aqueous Dispersing Medium

Another component of the compositions of the present invention is an aqueous dispersing medium. The phrase, "aqueous dispersing medium," as used herein, includes any solvent that is from 80 to 100% water wherein the balance of the material is a water soluble composition. Typical water soluble compositions include the low molecular weight alcohols, such as methanol, ethanol, and isopropanol. Additional solvents such as dimethylsulfoxide, tetrahydrofuran, and ethylene or propylene glycol may also be used. Alternatively, the aqueous dispersing medium may be 100% water. Deionized water is preferred.

The resulting composition is a carbon dispersion that is capable of depositing a uniform, low resistivity coating of carbon particles on the non-conductive surfaces of a through hole. The composition of the present invention may be used "as is," or it may be sold in concentrate form and then diluted up to tenfold (10:1), preferably up to fourfold (4:1), at the point of use. The composition may be diluted with an aqueous dispersing medium, which may include one or more of a buffer, a dispersing agent, a surfactant, or other ingredients.

Process Of Treating Through Holes

The present invention can be used for electroplating a conductive metal layer, such as copper, to the surface of a non-conductive material. In particular, this process comprises:

(a) preparing any of the liquid dispersions of carbon, as described previously, which are capable of uniformly depositing a coating of carbon on the non-conductive surfaces of a through hole;

(b) applying the liquid dispersion to the non-conductive surfaces of a through hole or another non-conductive substrate to form a dispersion coating thereon;

(c) optionally, separating substantially all of the aqueous dispersing medium from the carbon particles, typically by drying the dispersion, so the carbon particles are deposited on the non-conductive surface in a substantially continuous layer; and (d) electroplating a substantially continuous metal layer over the carbon particles deposited on the non-conductive surface.

Although rinsing, cleaning, conditioning, adhesion promotion, fixing, and microetching steps are not mentioned above, it is within the scope of the present invention to include one or more such steps, as well as other useful steps. A more detailed description of several of the steps of the present process follows.

Process Lines

The present process can be carried out in a variety of equipment. Two common types of equipment are vertical or dip process equipment, in which the reagents are in stationary baths into which the vertically-disposed boards are sequentially dipped, and conveyorized or horizontal equipment in which the boards are flooded or sprayed with the respective reagents while disposed and travelling substantially horizontally. Either type of equipment, or any combination of the two types of equipment, may be used within the scope of the present invention.

Cleaning

Commonly, the first step of the present process is, or includes, cleaning the substrate which is to be plated. In the cleaning step, the substrate is thoroughly wetted and contaminants such as grease, oil, or dirt are removed from the substrate which is to receive plating. The board is cleaned by contacting it with an alkaline aqueous solution or dispersion of a surfactant, which preferably is either cationic or non-ionic.

An exemplary formulation for a one liter batch is: from about 2 to about 20 g. of a nonionic surfactant, from about 5 to about 10 g. of a base (or enough base to raise the pH of the cleaner to a range from about 9 to about 11), and sufficient deionized water to make 1 liter. Optionally, 0.5 to about 5 g. of an alkylene glycol can be added to the composition. Optionally from about 0.5 to about 5 g. of a chelating agent may be added to the composition. Optionally, particularly if the base employed is an alkali metal salt, a buffer may be added to the composition.

The nonionic surfactants contemplated herein include the following:

LIST OF SURFACTANTS
TERGITOL 15-S-9
TERGITOL 15-S-15
NEODOL 25-12
IGEPAL CO730
IGEPAL CO887
TERGITOL NP-15
MIRANOL 2M-CA
MIRANOL 2M-CT
MIRANOL CM-SF
MIRANOL J2M-SF
MIRANOL S2M-SF and combinations of those surfactants.

The bases contemplated herein include lower alkanol amines (lower alkanol being defined as 1- to 4-carbon alcohol moieties), such as ethanolamines, for example mono-, di- or triethanolamine; alkali materials generally, such as alkali metal hydroxides, carbonates, and bicarbonates, for example potassium hydroxide, carbonate, or bicarbonate; other materials capable of raising the pH of the composition, preferably to at least about 9; and mixtures of such materials.

The alkylene glycols contemplated herein include 1- to 4-carbon alkylene glycols and their dimers and oligomers. Specific alkylene glycols contemplated herein include ethylene glycol, propylene glycol, butylene glycols, diethylene glycol, triethylene glycol and mixtures of such materials.

The chelating agents contemplated herein include alkali metal salts of ethylenediaminetetraacetic acid (EDTA), for example, sodium EDTA ($Na_4EDTA$). Other suitable chelating agents may also be readily found by one of ordinary skill in the art.

The buffers contemplated herein include any of the previously-described buffers, and the contemplated pH range of the cleaner composition can also be the same as the pH ranges given previously for the carbon composition.

Two more specific formulations contemplated for use herein are the following:

| Ingredients | g/l |
| --- | --- |
| MONOETHANOLAMINE | 5–10 g/l |
| NEODOL 91-8 | 2–10 g/l |
| ETHYLENE GLYCOL | 0.5–5 g/l |
| VERSENE 100 | 0.5–5 g/l |
| POTASSIUM HYDROXIDE | 5–30 g/l |
| POTASSIUM CARBONATE | 5–10 g/l |
| POTASSIUM BICARBONATE | 1–5 g/l |
| POTASSIUM SILICATE | 1–5 g/l |
| POTASSIUM BORATE | 1–5 g/l |
| TERGITOL 15-S-9 | 2–20 g/l |
| ETHYLENE GLYCOL | 0.5–5 g/l |

Cleaning compositions are conventionally used in connection with electroless plating and carbon dispersion coating processes. Thus, other cleaning compositions than those described above are known and may be used. One example of a known formulation is bath 1 described in column 16, lines 14–22 of U.S. Pat. No. 5,139,642, which is incorporated here by reference.

A board to be processed commonly is dip-processed in the cleaning solution for 4–6 minutes at 130° to 140° F. (54° to 60° C.). A board is commonly cleaned in a conveyorized process by flooding it at a similar temperature for a similar time. These conditions may need to be modified to suit a given situation.

Rinsing

Rinsing steps are optionally added between various reagent baths to prolong the life of the subsequent reagent baths. Typically, the rinsing medium is plain or deionized water. For example, if cleaning and conditioning steps are separately carried out, it is common to insert a water rinse step between the cleaning and conditioning steps.

Water rinsing may be carried out by flooding, dipping, or spraying, as appropriate, and can be carried out at a temperature the same as one of the temperatures at which the preceding or following steps are carried out, at an intermediate temperature (to provide a temperature transition), or at a different temperature (most simply, at room temperature). The rinsing time may vary—1–2 minutes at room temperature is a common rinsing time. Rinsing may be more or less aggressive. More aggressive rinsing may be carried out with mechanical scrubbing or by means of a high pressure spray. Less aggressive rinsing may constitute merely soaking the substrate in the rinsing medium without mechanical action.

Conditioning

In the conditioning step, the substrate is contacted with a conditioning agent, which is a substantive material, commonly a cationic material such as a polyamidoamine, a cationic polymer, a cationic surfactant, or the like. The conditioning agent is applied as an adhesion promoter so the substrate will be attractive to the anionic particles of carbon which are later applied by contacting the substrate with a carbon dispersion.

Most broadly, the conditioner is an alkaline aqueous solution or dispersion of a conditioning agent selected from the group consisting of:
SANDOLEC CF
SANDOLEC CU
SANDOLEC CS
SANDOLEC CL
SANDOLEC CT
CALLAWAY 6818
CYASTAT SP
CYASTAT LS
CYASTAT SN
CYANAMER A-370
MAGNIFLOC 496
DAXAD CP2
PRIMAFLO C C3
CAT-FLOC
CAT-FLOC T
RETEN 210
POLYTEC 7M
PERCOL 727
PERCOL 763
OCTOPOL SDE-25
OCTOPOL SDM-40
GLO-CLEAR 2202
GLO-CLEAR 2220
GLO-CLEAR 2283
PRIFRAC 2990
ALUBRAFSOFT GSS
FIBRABON 35
DENSEFLOC 30
CALLAWAY 68 17
CALLAWAY 6831
and combinations of those conditioners.

A representative formulation for a one liter batch of a conditioner is from about 5–30 g. of a base as previously defined, from about 5 to about 90 g. of a conditioning agent selected from the preceding list, and sufficient deionized water to make 1 liter. Optionally, 0.5 to about 5 g. of an alkylene glycol as previously defined can be added to the composition. Optionally from about 0.5 to about 5 g. of a chelating agent as previously defined may be added to the composition. Optionally, particularly if the base employed is an alkali metal salt, a buffer as previously defined may be added to the composition.

Two more particular formulations contemplated herein are the following:

| Ingredients | g/l |
| --- | --- |
| MONOETHANOLAMINE | 5–30 g/l |
| CALLAWAY 6818 | 10–90 g/l |
| SANDOLEC CF | 2–20 g/l |
| ETHYLENE GLYCOL | 0.5–5 g/l |
| VERSENE 100 | 0.5–5 g/l |
| POTASSIUM HYDROXIDE | 5–20 g/l |
| POTASSIUM CARBONATE | 2–10 g/l |
| POTASSIUM BICARBONATE | 2–5 g/l |
| (1)*CONDITIONER | 5–90 g/l |

(1)*Any conditioner or combination of conditioners listed in this application can be used.

Conditioning compositions are conventionally used in connection with electroless plating and carbon dispersion coating processes. Thus, other conditioning compositions than those described above are known and may be used. One example of a known formulation is bath 3 described in column 16, lines 23–29 of U.S. Pat. No. 5,139,642, which is incorporated here by reference.

A board to be processed commonly is dip-processed in the conditioning solution for 4–6 minutes at 130° to 140° F. (54° to 60° C.). A board is commonly conditioned in a conveyorized process by flooding it at a similar temperature for a similar time. These conditions may need to be modified to suit a given situation.

After the substrate is conditioned, it desirably is rinsed in water before contacting it with a carbon dispersion.

Cleaning/Conditioning

As an alternative to separate cleaning and/or conditioning steps, these two steps can be combined into one. Most simply, the ingredients of the cleaning and conditioning solutions previously defined can be consolidated into a single formulation which both cleans and conditions the substrates prior to the application of a carbon dispersion. Thus, the board is cleaned and conditioned by contacting it with an alkaline aqueous solution or dispersion of a surfactant and a conditioning agent.

An exemplary formulation for a one liter batch of a cleaner/conditioner is: from about 2 to about 20 g. of a nonionic surfactant as previously defined, from about 5 to about 90 g. of a conditioning agent as previously defined, from about 5 to about 10 g. of a base as previously defined (or enough base to raise the pH of the cleaner to a range from about 9 to about 11), and sufficient deionized water to make 1 liter. Optionally, 0.5 to about 5 g. of an alkylene glycol can be added to the composition. Optionally from about 0.5 to about 5 g. of a chelating agent may be added to the composition. Optionally, particularly if the base employed is an alkali metal salt, a buffer may be added to the composition.

A more specific cleaner/conditioner formulation contemplated herein is as follows:

| | |
|---|---|
| nonionic surfactant | 2–20 g/l |
| ethanol-substituted amine | 5–30 g/l |
| ethylene glycol | 0.5–5 g/l |
| Na$_4$EDTA | 0.5–5 g/l |
| cationic water-soluble polymer | 10–90 g/l |
| polyamidoamine | 2–20 g/l |
| sufficient DI water to make | 1 liter |

A board to be processed commonly is dip-processed in the cleaning/conditioning solution for 4–6 minutes at 130° to 140° F. (54° to 60° C.). A board is commonly cleaned and conditioned in a conveyorized process by flooding it at a similar temperature for a similar time. These conditions may need to be modified to suit a given situation.

Again, it is desirable, after a combined cleaning/conditioning treatment, to rinse the board in a water bath before contacting the substrate with the carbon dispersion.

Adhesion Promotion

The conductive coating can be formulated as described above to adhere directly to a non-conductive substrate, without the need for a separate adhesion promoter to aid the adhesion of the conductive coating.

In an alternative embodiment, adhesion of the conductive coating to a substrate can be promoted by incorporating a binding agent in the conductive carbon composition.

As another alternative, one or more adhesion-promoting ingredients can be separately formulated in a cleaning, conditioning, rinsing, or adhesion-promoting composition which is applied to the substrate before, after, or at the same time as the conductive composition is used. Conditioners and binding agents thus can be formulated separately, instead of or in addition to putting the conditioners and binding agents in the conductive composition per se.

All these adhesion-promoting methods and compositions are regarded to be part of the present invention, whether the adhesion promoter is formulated and applied with the conductive composition or in a separate composition.

The adhesion promoter can be applied in a dip or conveyorized process, within the scope of the present invention.

Conductive Coating

After the substrate is cleaned and conditioned, and (optionally) before or after adhesion to the substrate is promoted, the non-conductive surfaces of one or more through holes are contacted with a liquid carbon dispersion as previously described. The carbon dispersions described in U.S. Pat. No. 5,139,642 (which patent is incorporated here in its entirety by reference), as well as those described here, can be used within the scope of the present process invention.

The carbon dispersion is applied from a bath or by flooding in most instances. A dip time of 4–6 minutes at 90° F. (32° C.) is typical, though other times and temperatures may be appropriate.

Fixing

Preferably, after contacting the substrate with a carbon dispersion and before drying it according to the present process, one may employ a fixing step. The fixing step is important (though optional, in the sense that it is not necessarily indispensable) in the treatment of printed circuit boards, since it makes the carbon dispersion more workable. Fixing may be accomplished in at least two different ways, referred to here as the chemical fixing method and the physical fixing method.

The chemical fixing method can be carried out by applying a fixing solution to the surfaces which have been wetted by the carbon dispersion. The fixing solution removes excessive carbon composition deposits, crosslinks the first monolayer of carbon which is directly attached to the substrate, and thus smooths the carbon coating on the through hole surfaces by eliminating lumps and by making the coating more uniform.

In the chemical fixing step, the fixing solution may be water, aliphatic or aromatic solvents, or a dilute aqueous acid. If water is used, the water must be warm (120°–140° F., 49°–60° C.) to effect fixing, while the dilute acid solution is capable of fixing the bound carbon at room temperature or warmer. Fixing is typically accomplished by a 30–60 second exposure of the carbon coating to the fixing solution. While not wishing to be bound by any theory, it is believed that the dilute acid fixer works faster or under milder conditions, particularly when sodium carboxymethylcellulose is the binder, by neutralizing or crosslinking the carboxyl groups, thereby causing the dispersed and bound carbon particles to precipitate on the through hole bore.

Typical acid fixing solutions include dilute aqueous solutions containing from 0.1–5% by volume of an acid. Convenient acids useful herein include mineral acids, such as hydrochloric, phosphoric, nitric, or sulfuric acid. Organic carboxylic acids, such as acetic acid, citric acid, and others, may also be used. A specifically contemplated fixing solution is a dilute aqueous solution of sulfuric acid, such as an aqueous solution containing 0.1–2% sulfuric acid by volume. Acidic fixing solutions that contain less than 0.1% acid may require some heat to effect fixing within the typical 30–60 second exposure.

An acid fixing bath contemplated for use herein contains sufficient acid to provide a pH of from about 0.01–6, alternatively from about 0.1 to about 4, alternatively about 0.7, which may be provided by using from about 0.1 to about 0.5% by volume of concentrated sulfuric acid in deionized water. The normality of the acid may be from 0.07N to 0.17N, alternatively from 0.01N to 1.0N, alternatively from 0.001N to 5N. The bath may be used at room temperature (for example, about 70° F. or 20° C.), or alternatively at from about 125° to about 135° F. (from about 52° to about 57° C.).

The fixing step may be carried out in a vertical process in about 30–60 sec at 130° C., in one embodiment. The fixing step may also be carried out by using flooding or spraying processes, particularly in a horizontal or conveyorized embodiment.

In the physical fixing method, the through holes or other substrates which have been wetted with the carbon dispersion are subjected to a mechanical force which removes excess deposits of the carbon coating before it is dried. The mechanical force may be applied in a wide variety of ways, within the scope of the present invention.

One contemplated embodiment of this mechanical force is the action of a fluid jet contacting the surfaces which have been coated with the carbon dispersion. In a more specific embodiment, the fluid jet can be a jet of air or another gas directed through the through holes which have been treated with the carbon dispersion to blow away any excess accumulations of the carbon deposit, and particularly any occlusions of the carbon dispersion which can in some instances block the through holes.

In a practical printed wiring board fabrication line, the air jet can be provided in the form of an "air knife"—a curtain of moving air. The curtain is commonly stationary, and consists of air or another gas travelling perpendicular to the surface of the wiring board, through which the wiring board is passed to blow out the through holes and thus fix the carbon dispersion. The air pressures contemplated for use in an air knife process are typically 3–4 psi—2–3 $N/cm^2$—or more broadly from less than 3 psi (2 $N/cm^2$) to 30 psi (20 $N/cm^2$) or more. The curtain of air may also be heated, thus further assisting in drying the substrate.

In a particular embodiment of the invention, any of these fixing steps may be used with a carbon dispersion which lacks all the adjuvants of the carbon dispersion specified in the present composition inventions which are not essential to maintain the stability of the dispersion. Alternately, the carbon dispersions described in U.S. Pat. No. 5,139,642 can be fixed as described here.

Drying

After the carbon dispersion is applied and (when applicable) fixed, the carbon-coated portion of the substrate typically is dried, thus depositing a dry carbon coating on the substrate. The substrate may be dried in an oven. Drying may be accomplished by using heated air (in the fixing step or later), by employing heat lamps or other radiant heat sources, by simple air drying at ambient temperature, or by other drying techniques. A skilled person is readily able to devise an appropriate method of drying the substrate. Typical drying conditions might be oven-drying for 15 to 18 minutes at 140° to 180° F. (60–82° C.). The method described in U.S. Pat. No. 5,139,642 may also be employed.

Microetching

When the through holes of printed wiring boards are being prepared for plating, the boards normally are already copper clad. The typical processes for preparing the through holes incidentally contact the copper-clad surfaces with the various through hole treating reagents, including the carbon dispersion. It commonly is desirable to remove the carbon dispersion coating and other residues from the already copper-clad surfaces of the printed wiring board before the through holes of the board are electroplated. One such removal process contemplated here is called microetching.

Microetching is carried out by exposing the carbon-coated printed wiring board to an etchant which removes a slight amount of copper from the copper clad surfaces of the substrate, without appreciably attacking the carbon coating or the non-carbon clad surfaces. The carbon coating typically is sufficiently porous to allow the underlying copper layer to be attacked. When the underlying surface to which the carbon deposit adheres is microetched, the carbon deposit flakes away from the copper-clad surfaces while remaining intact in non-copper-clad areas, such as the through hole walls.

Microetching compositions are conventionally used in connection with carbon dispersion coating processes. One example of a known formulation is bath 9 described in column 17, lines 19–28, of U.S. Pat. No. 5,139,642, which is incorporated here by reference.

Microetching compositions may be deployed by dipping the substrate in a microetch bath or by spraying the substrate with a microetch composition.

After microetching, the substrate is preferably rinsed to remove residual flakes of carbon and to maintain the integrity of the subsequent reagents. The rinse may be carried out by immersing the substrate in a bath, by spray rinsing the substrate, or otherwise.

The result of microetching is that the originally copper clad surfaces are freed of the carbon deposit, while the through hole walls retain the deposit and thus remain conductive. The copper-clad surfaces thus can form low-resistance connections with the plating electrodes when the through holes are electroplated.

Anti-Tarnish Treating

It commonly is desirable to treat the copper-clad surfaces of the printed wiring board with an anti-tarnishing agent which prevents corrosion of the copper surfaces. Anti-tarnishing agents and treatments are conventional. One anti-tarnish bath is described in U.S. Pat. No. 5,139,642, column 17, lines 29–33. Many other compositions are known to those skilled in the art. The contemplated process can be carried out by spraying the anti-tarnish composition into contact with the copper clad surfaces of the printed wiring board, or by a dip process.

After the anti-tarnish step, the substrate is preferably rinsed. The rinse may be carried out by immersing the substrate in a bath, by spray rinsing the substrate, or otherwise.

Drying

After the through holes are made conductive as described above, they are commonly dried prior to electroplating. Drying may again be carried out in any of the conventional ways known to those skilled in the art, such as those described previously.

Double-Pass Process

In some instances, it may be desirable to repeat some of the process steps previously defined. For example, the process can be carried out with the following sequence of steps, including some repetitive steps compared to the "single-pass" process which has been described so far:

cleaning/conditioning
rinsing
contacting with carbon dispersion
drying
cleaning/conditioning
rinsing
contacting with carbon dispersion
drying
microetching
rinsing
anti-tarnish treating
rinsing
drying Each step of the foregoing double-pass process can be carried out mostly or entirely like the corresponding step of a single-pass process.

Electroplating

Electroplating of through holes may be carried out essentially conventionally, although it typically can be carried out more quickly according to the present invention than before because the carbon coatings according to the present invention commonly have a lower electrical resistance than before, which leads to faster plating. The electroplating processes described below and other processes known to those skilled in the art, including the particular process employed in U.S. Pat. No. 5,139,642, from col. 17, line 43, to column 18, line 5, may be used.

Result Of Through Hole Plating Process

When the through-hole plating process is complete, the deposited plating is resistant to pullaway (which resembles a blister in the plating) and other adhesion defects, even when the most severe thermal shock tests are performed.

Printed Wiring Boards

The present invention allows the manufacture of a printed wiring board having conductive through holes. Such boards are made by applying any of the compositions described above to a printed wiring board having one or more through holes, in accordance with any of the methods described above. The printed wiring board may have more than one coating, but preferably has a single layer, provided by a one-pass coating process, which provides the through holes with adequate conductivity for electroplating. This printed wiring board is then electroplated to provide a printed wiring board having copper clad through holes.

Resistance Measurements

The resistance of a printed wiring board which has been treated to make its through holes conductive is measured as an indication of the amount of time which will be required to electroplate the through holes. The lower the resistance, the more rapidly electroplating can proceed. The resistance of the through holes of a double-sided circuit board is conventionally measured by measuring the resistance between the two metal-clad surfaces on opposite ends of the through holes. Thus, one through hole resistance value is obtained for an entire printed wiring board before electroplating proceeds.

A single printed wiring board commonly has many through holes of varying diameters. The number of through holes depends upon the size of the circuit board and the particular circuit it will carry. For example, a typical 18 inch by 24 inch (46 cm by 61 cm) board may have 3000 holes with diameters varying from about 6 mils (1.5 mm) to about 0.25 inch (6 mm). Also, a board may have a thickness of from about 1 mil (25 microns) to about 0.25 inch (6 mm.).

Multiple through holes create parallel conductive paths, so the net resistance of all the through holes on the board is less than the resistance of one through hole. The more electrically interconnected through holes there are, the lower the resistance, other things being equal. The diameter of the through hole determines the cross-sectional area of its conductive surface, so a larger diameter through hole has a lower resistance than a smaller diameter through hole, other things being equal. The thickness of the board determines the length of each conductive through hole. The thicker the board, the longer each through hole and the higher its resistance, other things being equal.

Finally, "other things" are not equal, so even if the number and dimensions of the through holes are known, the resistance of each through hole cannot be directly calculated with any accuracy. Different through holes on the same board may have different coating thicknesses, the coating is applied on an irregular bore surface, fluid circulation in a bath to the various holes is different, and so forth.

Notwithstanding these many variations, the industry commonly draws conclusions about the conductivity of the through holes from a single resistance measurement per printed wiring board. For example, the 18 by 24 inch (46 by 61 cm) board referred to previously, coated with the preferred graphite composition according to the present invention in one pass, commonly has a resistivity of about one ohm through its through holes, which rises to about 10 ohms after microetching. The same board coated using the commercially available two-pass BLACKHOLE carbon black process has resistivities more than ten times as great, and sometimes 50 to 70 times as great, as those of the preferred graphite composition. Thus, where the resistance of a printed wiring board is given in this specification or in the claims, or if a resistance is given without specifying the manner of measurement, this single measurement, made prior to electroplating, is meant. Of course, if two boards have identical numbers, patterns, and sizes of through holes, the resistances of the entire boards can be directly compared to obtain useful results.

When the present invention is used to improve the through hole conductivity of an entire printed wiring board, the board has an electrical resistivity of less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, optionally less than about 2 ohms, optionally less than about 1 ohm, each measured prior to electroplating the through hole.

One can also determine the resistance of a single through hole. This can be done in at least two ways. One way is to coat the through hole of a coupon (sample of metal-clad printed wiring board material which is not intended to be used in a circuit) or an actual printed wiring board which has only a single through hole, so the resistance of the board is the same as the resistance of that through hole. A second way is to isolate one through hole electrically by severing the cladding which links other through holes to the through hole which is being measured for resistivity. Thus, where the resistance of a through hole is given in this specification or in the claims, the resistance of a single through hole in electrical isolation, measured before electroplating, is meant.

When the present invention is used to improve the conductivity of an individual through hole, the treated through hole has an electrical resistivity of less than about 5000 ohms, optionally less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, each measured prior to electroplating the through hole.

Coating Uniformity Determination

A thin, uniform coating of the carbon composition on the through holes is important so the plating which is deposited on the coating will not suffer from pullaway, particularly when subjected to the thermal shock of soldering.

The inventors contemplate that the coating ideally will be nearly as thin as the diameters of the dispersed particles of carbon, so it will form a monolayer of carbon particles. For example, a composition containing one-micron mean diameter particles would provide a film on the order of one micron thick. More particularly, the inventors contemplate a coating of from about one to about three microns thick. Thinner coatings are acceptable until the coating becomes so thin that complete coverage is not obtainable.

The inventors contemplate that coatings more than about 3 microns thick will start to present problems. Pullaway (a place where the plating delaminates) becomes more probable in this thickness range. A region of the coating as thick as about 7 microns is contemplated to be less desirable, while a coating of about 12 microns is contemplated to be still less desirable. When part of the coating becomes as thick as roughly 7 microns, it becomes visible when a 200 power (200× magnification) microscope is used to examine the plated through hole. Thus, another definition of the appropriate coating thickness is a coating which is too thin to see in a plated through hole cross-section under a 200 power microscope.

The degree of uniformity of the coating is sometimes expressed qualitatively by reporting that the coating in question exhibits, or is free of, lumpiness or localized areas having a thick coating of the carbon coating. Lumpiness (if present) typically is found at the entrance or exit of a through hole (i.e. at the corners of a rectangular cross-section of a cylindrical hole), and is manifested as visible (under a 50× microscope) non-uniform areas of plating projecting inwardly from the plane defined by the wall of the through hole bore. Expressed another way, a plated through hole bore is free of lumpiness if the plating appears to be a straight line down each side of the through hole connecting the conductive cladding at each end of the hole, when viewed in cross-section at 50× magnification.

The following examples are provided to describe specific embodiments of the invention and to demonstrate how it works. By providing those specific examples, the inventors do not limit the scope of the invention. The full scope of the invention is all the subject matter defined by the claims concluding this specification, and equivalents thereof.

EXAMPLE 1

Preparation of Cleaner/Conditioner Concentrate

1. To a beaker capable of containing a 1 liter volume, were added approximately 400 g of distilled or deionized water (hereinafter collectively "DI water") and 60 g of TERGITOL 15-S-9 secondary alcohol polyethylene glycol ether surfactant (sold by Union Carbide Corp., New York City, N.Y.), and the mixture was stirred for about ten minutes. Thereafter, 100 g of monoethanolamine (Union Carbide) was added and the mixture was again stirred for about ten minutes. To the mixture was then added 300 g of the cationic water soluble polymer CALLAWAY 6818 (Exxon Chemical Company, Columbus, Ga.) and the mixture again was allowed to stir for approximately ten minutes. Thereafter, to the mixture was added 50 g of the cationic polyamidoamine SANDOLEC® CF (Sandoz Chemicals), and the mixture was allowed to stir for approximately ten minutes. To the mixture was then added 7 g of ethylene glycol and the mixture was allowed to stir for approximately ten minutes. Thereafter, 10 g of tetrasodiummethylenediaminetetraacetic acid (Na4EDTA, sold as VERSENE 100 by Dow Chemical Company, Midland, Mich.), was added to the mixture, and the mixture was stirred for approximately ten minutes. Sufficient DI water was then added to bring the volume to 1 liter, and the mixture was stirred for about 10 minutes. The resulting cleaner/conditioner concentrate was considered acceptable if it exhibited a pH of 10±0.4 and the specific gravity at 20°/4° C. of 1.034±0.007.

EXAMPLE 2

Preparation of the Working Cleaner/Conditioner

The working cleaner/conditioner was prepared by combining one volume of the cleaner/conditioner concentrate from Example 1 with 9 volumes of DI (deionized) water.

EXAMPLE 3

Cleaning and Conditioning Circuit Boards

Circuit boards having through holes were immersed for 4 to 6 minutes in a tank containing the working cleaner/conditioner solution at a temperature within the range of 140°–160° F. (60°–71° C.), a normality of 0.15 to 0.20, and a pH within the range of 9.5 to 11.8. The tank for the cleaner/conditioner solution was stainless steel, and it had a stainless steel heater element. Alternatively, a polypropylene tank could also be used.

EXAMPLE 4

Preparation Of A Working Solution Of The Carbon Dispersion

Colloidal graphite (19.9 wt. %) having a particle size of about 1 micron, was combined with 2.14 wt. % CMC 7L carboxymethylcellulose, 0.1% wt. TAMOL 819 surfactant, and water, forming a dispersion. The pH of the dispersion was 8.82, the viscosity (at 2060 rpm, 77° F.) was 145 cps, and the film resistivity of a 1 mil (25 micron) dried coating of the dispersion was 11.8 ohms per square.

200 g of the colloidal graphite dispersion and 790 g of DI water were mixed, and the mixture was stirred for approximately 20 minutes. To the mixture was then added 6 g of potassium carbonate (powder) and the mixture was stirred for approximately 15 minutes. Thereafter, 1 g of potassium bicarbonate crystals were added to the reaction mixture and it was mixed for about 15 minutes. The pH of the mixture was then measured to determine if it fell within the range of 10.7 to 11.0. For solutions having a pH above 11.0, additional potassium bicarbonate was added. For solutions having a pH below 10.7, additional potassium carbonate was added to bring it within the desired pH range of 10.7–11.0. When the solution was in the desired pH range, to it were added 0.2 g of the acrylic emulsion polymer ACRYSOL® I-1955 and 0.8 g of the acrylic emulsion polymer ACRYSOL® I545 (Rohm and Haas), and the mixture was stirred for approximately 10 minutes. Thereafter, 1.2 g of the anionic fluorochemical surfactant FLUORAD® FC-120 was added to the mixture and the mixture was stirred for approximately 40 minutes.

The resulting solution was considered acceptable for use if the following criteria were met: percent solids fell within the range of 4.8 to 5.3%; the normality fell within the range of 0.11 to 0.17; and the pH fell within the range of 10.7 to 11.0.

EXAMPLE 5

Coating The Through Holes Of A Circuit Board With Graphite Dispersion

The preferred equipment for the working dispersion bath comprises a polyethylene, polypropylene, or a stainless steel 316 tank. Such a tank is outfitted with a circulating centrifugal pump that is capable of turning over the tank volume three to six times per hour.

A circuit board having through holes was cleaned and conditioned by immersion for about 4–6 minutes in a bath at 130° F.–140° F. (about 54° to about 60° C.) containing the working cleaner/conditioner solution of Example 3. Thereafter, the board was rinsed for about one minute in deionized water at ambient room temperature (65° F.–95° F.; 18° C.–35° C.). The rinsed board was immersed from four to six minutes in a bath containing the working graphite dispersion of Example 4 at ambient room temperature.

EXAMPLE 6

Comparison Of The Resistance Of Identical Panels Having Synthetic Or Natural Graphite Uniformly Deposited Thereon 1. The Circuit Board Panels Fourteen identical circuit board panels ("panels") were used in this comparison. Each panel was a 3 inch (76 mm.)

by 3 inch (76 mm.) square, and each had the same number and pattern of through holes.

2. The Graphite Dispersions

The graphite dispersions were prepared by dispersing the following coating-forming ingredients in a suitable amount of deionized water. The average particle sizes of the respective natural and synthetic graphite dispersions were measured and found to be comparable, though not the same as the average particle sizes reported by the vendors of the materials.

| Synthetic | Natural |
| --- | --- |
| 11.00 g Graphite (Micro 440)[1] | 11.00 g Graphite 850[2] |
| 0.44 g CMC 7M | 0.55 g CMC 7M |
| 0.60 g TAMOL 819 | 0.10 g TAMOL 819 |
| 2.00 g $K_2CO_3$ | 2.00 g $K_2CO_3$ |
| 1.00 g $KHCO_3$ | 1.00 g $KHCO_3$ |
| 1.00 g ACRYSOL I-1955 | 1.00 g ACRYSOL I-1955 |
| pH 10.66 | pH 10.5 |

[1] Asbury Graphite Mills Inc., Asbury, N.J.; Size reported by vendor: 0.44–0.55 microns.
[2] Asbury Graphite Mills Inc., Asbury, N.J.; Size reported by vendor: 3.74 microns (mean); 2–5 micron (range).

3. The Process

Both sample panels were run through the following steps:

| | | | |
| --- | --- | --- | --- |
| I. | Cleaner | 5 min. | 140° F. |
| II. | Rinse | 1 min. | Room Temp. |
| III. | Conditioner | 5 min. | Room Temp. |
| IV. | Rinse | 1 min. | Room Temp. |
| V. | Graphite Disp. | 5 min. | Room Temp. |
| VI. | Dry | 20 min. | 190° F. |
| VII. | Micro Etch | 50 micro inches removed | Room Temp. |
| VIII. | Rinse | 1 min. | Room Temp. |
| IX. | Dry | 10 min. | 190° F. (88° C.) |

4. Resistance Measurements

The resistivity of several comparable coupons coated with each composition was measured after drying step IX. Each panel was 3 inches (76 mm.) square, with the same pattern of through holes on each.

| Synthetic Graphite | | Natural Graphite | |
| --- | --- | --- | --- |
| Micro 440 (Asbury) | | Graphite 850 (Asbury) | |
| (1) | 109 ohms | (9) | 3000 ohms |
| (2) | 85 ohms | (10) | 1000 ohms |
| (3) | 180 ohms | (11) | 1100 ohms |
| (4) | 210 ohms | (12) | 1500 ohms |
| Average: | 146 ohms | Average: | 1650 ohms |
| #GraphoKote 90 (Dixon Products, Lakehurst, N.J.) (Vendor's reported size 80% > 1 micron) | | Graphite 450 (Asbury) (vendor's reported size 3.5–5.5 microns) | |
| (5) | 3.7 kilohms | (13) | 20 kilohms |
| (6) | 0.8 kilohms | (14) | 19 kilohms |
| (7) | 4.3 kilohms | (15) | 59 kilohms |
| (8) | 3.9 kilohms | (16) | 26 kilohms |
| Average: | 3.2 kilohms | Average: | 31 kilohms |

The data in this Example demonstrates that a uniform deposit of synthetic graphite was many times more conductive than a comparable deposit of natural graphite.

EXAMPLE 7

Comparison Of The Circuit Board Resistivity After Treatment By The Graphite Composition And Method Of The Present Invention, And After Treatment By The Carbon Black Composition And Method Of the '741 Patent

1. The Circuit Board Panels

In Example 7, identical circuit board panels ("panels") were compared. The compared panels were of the multilayer type and of the double-sided type. Each panel was 3 inches (76 mm.) square. Each type of panel had the same number and pattern of through holes. The through hole diameters of each type of panel were 0.15–1.0 mm. Each multilayer panel had four layers of copper film.

2. The Carbon Black Process

The carbon black composition and process that was used in this comparison is commercially available under the trade name BLACKHOLE from MacDermid Incorporated, Waterbury, Conn. According to the manufacturer, the BLACKHOLE carbon black process requires a double pass through the process to obtain good results. The cleaners and conditions that were used in the carbon black process were those recommended by the manufacturer, i.e., BLACK HOLE CLEANER II and BLACK HOLE CONDITIONER.

Three variations of the carbon black technology are presented as Runs 1, 2, and 3 below. In the process of Run 1, duplicate multilayer and double-sided panels were subjected to the following sequence of steps:

| Carbon Black Process | | |
| --- | --- | --- |
| a) Cleaner/Conditioner (2.5% v/v) | 5 minutes | 135° F. (57° C.) |
| b) Rinse | 1 minute | Room Temp. |
| c) Conditioner (2.5%) | 5 minutes | Room Temp. |
| d) Rinse | 1 minute | Room Temp. |
| e) Carbon Black Dispersion (BLACKHOLE) | 5 minutes | Room Temp. |
| f) Oven Dry | 20 minutes | 190° F. (88° C.) |
| g) Carbon Black Dispersion (BLACKHOLE) | 5 minutes | Room Temp. |
| h) Oven Dry | 5 minutes | 190° F. (88° C.) |

The resistances of the first set of panels were measured between comparable points after Step (f) of the process of Run 1, representing a single pass.

| Resistance (Run 1) After Step (f) of Run 1 | |
| --- | --- |
| Panel | Resistance |
| (1) Multilayer | 3.6 kilohms |
| (2) Multilayer | 3.7 kilohms |
| (3) Multilayer | 1.2 kilohms |
| (4) Multilayer | 1.3 kilohms |
| (5) Double-sided | 1.9 kilohms |
| (6) Double-sided | 2.1 kilohms |
| (7) Double-sided | 1.2 kilohms |
| (8) Double-sided | 1.4 kilohms |

The resistances of a second set of panels were measured after Steps (f) (representing a single pass) and (h) (representing a double pass) of Run 1. These resistivities after the single pass and double pass stages of Run 1 are compared below.

Comparative Resistance Of Run 1

| Resistance After single Pass | Resistance After Double Pass |
|---|---|
| Multilayer Panels: | |
| (1) 5 kilohms | (1) 2.4 kilohms |
| (2) 6 kilohms | (2) 2.2 kilohms |
| Double-sided Panels: | |
| (3) 7 kilohms | (3) 2.0 kilohms |
| (4) 6 kilohms | (4) 1.9 kilohms |

Run 2 is identical to Run 1 except that a conditioning step (Step (g)) and a rinse step (Step (h)) were added below before the second application of the carbon black dispersion. The process of Run 2 was as follows:

| | | | |
|---|---|---|---|
| a) | Cleaner/Conditioner (2.5%) | 5 minutes | 135° F. (57° C.) |
| b) | Rinse | 1 minute | Room Temp. |
| c) | Conditioner (2.5%) | 5 minutes | Room Temp. |
| d) | Rinse | 1 minute | Room Temp. |
| e) | Carbon Black Dispersion (BLACKHOLE) | 5 minutes | Room Temp. |
| f) | Oven | 20 minutes | 190° F. (88° C.) |
| g) | Conditioner (2.5%) | 5 minutes | Room Temp. |
| h) | Rinse | 1 minute | Room Temp. |
| i) | Carbon Black Dispersion (BLACKHOLE) | 5 minutes | Room Temp. |
| j) | Oven | 20 minutes | 190° F. (88° C.) |

Comparative Resistance After Single Pass and Double Pass of Run 2

| Panel | Resistance After Single Pass | After Double Pass |
|---|---|---|
| Multilayer | (1) 5.5 kilohms | (1) 3.3 kilohms |
| Multilayer | (2) 6.4 kilohms | (2) 3.9 kilohms |
| Double-sided | (3) 6.9 kilohms | (3) 1.5 kilohms |
| Double-sided | (4) 4.5 kilohms | (4) 1.8 kilohms |

Run 3 employed Steps (a) through (f) of Run 1 and added a conventional microetching step (Step (g)). The microetching step removed 50 micro inches (1.27 microns) of copper. Thereafter, Steps (a) through (h) of Run 1 were repeated as Steps (h) through (m) of Run 3. The process of Run 3 was as follows:

| | | | |
|---|---|---|---|
| a) | Cleaner/Conditioner (2.5%) | 5 minutes | 135° F. (57° C.) |
| b) | Rinse | 1 minute | Room Temp. |
| c) | Conditioner (2.5%) | 5 minutes | Room Temp. |
| d) | Rinse | 1 minute | Room Temp. |
| e) | BLACKHOLE | 5 minutes | Room Temp. |
| f) | Oven | 20 minutes | 190° F. (88° C.) |
| g) | Microetch | | |
| | After microetch, the boards were processed through the same line again: | | |
| h) | Cleaner/Conditioner (2.5%) | 5 minutes | 135° F. (57° C.) |
| i) | Rinse | 1 minute | Room Temp. |
| j) | Conditioner (2.5%) | 5 minutes | Room Temp. |
| k) | Rinse | 1 minute | Room Temp. |
| l) | BLACKHOLE | 5 minutes | Room Temp. |
| m) | Oven | 20 minutes | 190° F. (88° C.) |

Comparative Resistance After Steps (f) (single pass), (g) (microetch), and (m) (double pass) of Run 3

| Panel | Resistance After Single Pass | After Double Pass |
|---|---|---|
| (1) Multilayer | 5.5 KΩ | 3.2 KΩ |
| (2) Multilayer | 6.4 KΩ | 3.9 KΩ |
| (3) Double-sided | 6.9 KΩ | 1.1 KΩ |
| (4) Double-sided | 4.5 KΩ | 1.7 KΩ |

3. The Graphite Dispersion Of The Present Invention

In each of Runs 4–7, panels of identical size and configuration, as used above, were subject to the same preparative steps (Steps (a)–(d)) described above. However, instead of them being immersed in a carbon black dispersion, the four panels of each of Runs 4–7 were immersed in the graphite dispersion of Example 8.

The process of Runs 4–7 comprised the following steps:

| | | | |
|---|---|---|---|
| a) | Cleaner/Conditioner (2.5%) | 5 minutes | 140° F. (60° C.) |
| b) | Rinse | 1 minute Room Temp. | |
| c) | Conditioner (2.5%) | 5 minutes Room Temp. | |
| d) | Rinse | 1 minutes Room Temp. | |
| e) | Graphite Dispersion | 5 minutes Room Temp. | |
| f) | Oven Dry | 20 minutes 190° F. (88° C.) | |

Resistance Measured After Single Pass

| | Panel | Resistance |
|---|---|---|
| RUN 4 | (1) Multilayer | 60 ohms |
| | (2) Multilayer | 80 ohms |
| | (3) Double-sided | 27 ohms |
| | (4) Double-sided | 42 ohms |
| RUN 5 | (1) Multilayer | 52 ohms |
| | (2) Multilayer | 73 ohms |
| | (3) Double-sided | 53 ohms |
| | (4) Double-sided | 93 ohms |
| RUN 6 | (1) Double-sided | 60 ohms |
| | (2) Double-sided | 172 ohms |
| | (3) Double-sided | 71 ohms |
| | (4) Double-sided | 126 ohms |
| RUN 7 | (1) Multilayer | 89 ohms |
| | (2) Double-sided | 95 ohms |
| | (3) Multilayer | 89 ohms |
| | (4) Double-sided | 23 ohms |

Double Pass (Graphite)

To test the effect of a double pass through the graphite dispersion, a pair of multilayer panels were subjected to the process of Steps (a) through (f) and their respective resistances measured:

Resistance After The First Pass

| (1) Multilayer | 24 ohms |
|---|---|
| (2) Multilayer | 30 ohms |

Thereafter, multilayer panels were again immersed in the graphite dispersion (Step (e)) and then dried (Step (f)) and their respective resistances were again measured:

| Resistance After The Second Pass | |
|---|---|
| (1) Multilayer | 8 ohms |
| (2) Multilayer | 8 ohms |

In another series of runs, a second pair of multilayer panels were subjected to two passes through the process of Steps (a) through (f) and their resistance were measured after Step (f) of each pass:

| Resistance After First Pass | |
|---|---|
| (3) Multilayer | 32 ohms |
| (4) Multilayer | 34 ohms |
| Resistance After Second Pass | |
| (3) Multilayer | 13 ohms |
| (4) Multilayer | 11 ohms |

The data in this Example establishes that the graphite compositions of the present invention, when used in the process of the present invention, produced through hole deposits of graphite that had substantially higher conductivities (lower resistivities) than the through hole deposits of carbon black produced by the composition and methods of the '741 patent. Examination of cross-sections of these through holes also revealed that the graphite composition provided no pullaway and improved adhesion compared to carbon black compositions.

EXAMPLE 8

For use in Examples 9–11 herein, the following cleaner/conditioner, graphite composition, and fixer solutions were prepared.

Working Cleaner/Conditioner

A working cleaner/conditioner solution was prepared by diluting one volume of the cleaner/conditioner concentrate sold commercially as SHADOW cleaner/conditioner 1 by Electrochemicals, Inc., Youngstown, Ohio with nine volumes of DI water. In practice, the working cleaner/conditioner was maintained within the range of 140°–160° F. (60°–71° C.).

Graphite Composition:

Using the method of Example 4, the following components were mixed together and the pH adjusted to 10.5:

| 263 g | graphite |
|---|---|
| 5829 ml | DI water |
| 36 g | potassium carbonate |
| 28 g | sodium carboxymethylcellulose |
| 6 g | potassium bicarbonate |
| 1.2 g | ACRYSOL I-1955 |
| 4.8 g | ACRYSOL I-545 |
| 7.4 g | FLUORAD FC-120 |
| 1.85 g | TAMOL 819 |

Fixer Bath:

Sixteen ml. of concentrated sulfuric acid were added to a sufficient volume of DI water to avoid splattering and then diluted to 4 liters. In practice, the diluted sulfuric acid solution is placed in a fixer bath and heated between 120° F.–140° F. (49°–60° C.). The graphite composition of the present invention was fixed by immersing the graphite coated circuit board or dielectric in the bath for a time between thirty seconds and one minute.

EXAMPLE 9

A desmeared 3 inch (76 mm.) square four layer circuit board (Sample 1) and a 2 inch (51 mm.) square four layer circuit board (Sample 2) were treated with the working cleaner and conditioner of Example 8, rinsed with DI water for about 15–20 seconds, and then treated with the graphite composition of Example 8. The resistivity of the dried boards was as follows:

| Sample 1: | 10 ohms |
|---|---|
| Sample 1 (after etching) | 38.1 ohms |
| Sample 2 | 19 ohms |

EXAMPLE 10

Effect Of Dilution On The Composition And Method Of the Present Invention

A composition with the following ingredients is prepared according to the method of Example 4:

| Parts By Weight | Component |
|---|---|
| 263 | graphite |
| 1029 | water |
| 36 | potassium carbonate |
| 28 | sodium carboxymethylcellulose |
| 6 | potassium bicarbonate |
| 1.2 | ACRYSOL I-1955 |
| 4.8 | ACRYSOL I-545 |
| 7.4 | FLUORAD FC-120 |

In this Example, three concentrations of the graphite composition are tested on both 2"×2" double-sided ("DS") and multilayer ("ML") coupons. The concentrations tested are "as is," at a two-to-one (2:1) dilution by volume and at an eight-to-one (8:1) dilution by volume.

LINE MAKEUP FOR GRAPHITE PROCESS

1) Working Cleaner/Conditioner from Example 8, 5 minutes, at 149° F. (65° C.).

2) Rinse—DI water, 15–20 seconds.

3) Graphite composition ("as is," 2:1, or 8:1), 5 minutes, at 75° F. (24° C.).

4) Fixer as per Example 8, when used below.

5) Dry a) blow dry 1–2 minutes.

b) oven dry 15 minutes, at 180° F. (82° C.).

| | RESULTS | |
|---|---|---|
| Coupon | Measured Resistivity (ohms) | Typical results (predicted and observed) |
| "As is" ML, with fixer | 1.1 | Small holes clogged, surface lumps; poor result |
| "As is" DS, with fixer | 1.2 | Small holes clogged, surface lumps; poor result |
| 2:1 ML, with fixer | 6.5 | 100% surface coverage; excellent result |
| 8:1 ML, with fixer | 336 | 90% surface coverage; |

RESULTS

| Coupon | Measured Resistivity (ohms) | Typical results (predicted and observed) |
|---|---|---|
| 8:1 DS, with fixer | 49 | good result 90% surface coverage; good result |
| "As is" ML, no fixer | 1.1 | Small and large holes clogged, no surface lumps; poor result |
| "As is" DS, no fixer | 0.8 | Small and large holes clogged, no surface lumps; poor result |
| 8.1 ML, no fixer | 7.1 | 100% surface coverage, but non-uniform coating; poor result |
| 8.1 DS, no fixer | 7.5 | 100% surface coverage, but non-uniform coating; poor result |

The date for Examples 10 and 11 shows that the "as-is" composition used here is apparently too concentrated and forms an undesirably thick coating, with or without a fixer. The 2:1 dilution with a fixer provides excellent results—the resistance is low, and 100% surface coverage is obtained (typically providing an excellent, uniform coating of desirable thickness). The 8:1 dilution was found (under the conditions of this test) to provide undesirably low surface coverage (90%) and high resistivity if a fixer was used. The 8:1 dilution without a fixer would typically provide an undesirably non-uniform coating.

EXAMPLE 11

Effect Of Dilution Of The Graphite Composition And Etch On Resistivity

| Coupon | Pre Etch Resistivity (From Example 10) | Post Etch Resistivity |
|---|---|---|
| "As is" ML, fixer | 1.1 ohms | 508 ohms |
| "As is" ML, no fixer | 1.1 ohms | 223 ohms |
| 2:1 ML, fixer | 6.5 ohms | 156 ohms |
| 8:1 ML, fixer | 336 ohms | >4,600 ohms |
| 8:1 ML, no fixer | 7.1 ohms | 417 ohms |

EXAMPLE 12

Effect of Dilution on Coverage as Determined by Back Light Testing

The composition of Example 10 was further diluted and tested as in Example 10 for surface coverage. No fixer was used in this experiment. The resulting data is shown in the table below.

| Coupon | % Coverage |
|---|---|
| 8:1 ML, no fixer | 90–95% |
| 14:1 ML, no fixer | 60–70% |
| 30:1 ML, no fixer | 40–60% |
| 70:1 ML, no fixer | 0–20% |
| 150:1 ML, no fixer | 0.5% |

This data shows that coverage is reduced as the graphite composition is diluted. A 30:1 or less dilution was shown to be usable, while a 150:1 dilution was shown to be unusable for a single pass process, in this instance. It is contemplated that all the tested dilutions could be made to provide acceptable results by using a multiple pass process.

EXAMPLE 13

Effect Of pH Of The Graphite Dispersion's Ability To Act As A Conductive Surface For Electroplating A stock bath of the graphite dispersion of the present invention was prepared as described herein and its pH was found to be 10.47. This sample was run as the control. Two aliquots of the dispersion had their pH's adjusted to 5.18 and 13.3 respectively. Three identical panels, namely panel #1 (pH 10.47), panel #2 (pH 5.18), and panel #3 (pH 13.3), were subjected to the following process which differed for each panel only in the indicated pH of the dispersion.

| | |
|---|---|
| 1) Cleaner/Conditioner | 162° F. (72° C.), 5 minutes |
| 2) Water rinse | Room Temp. (RT), 2 minutes |
| 3) Graphite Dispersion Bath | RT, 5 minutes |
| 4) Fixer | 120° F. (49° C.), 45 seconds |
| 5) Dry | Blow Dry |
| 6) Etch | 30 micro inches (0.76 microns) of copper removed |
| 7) Preplate | Clean Circlean S, 120° F. (49° C.), 30 seconds |
| 8) Rinse | 30 seconds |
| 9) Etch sodium persulfate | 1 min. 15–20 micro inches (0.38 to 0.5 microns) removed |
| 10) Rinse | 1 minute |
| 11) Electroplate | 5 minutes, 15 amp/3 panels |

All three panels initiated at an equal time (1 minute). After five minutes, the coverage was the same on all panels and no voids, blisters or lumps were observed under an 8× eye loupe.

The resistivities of the three panels were measured at various stages during the process of Example 13. The three panels based upon the pH of the graphite dispersion, are identified as #1 (control, pH 10.47), panel #2 (pH 5.18), and panel #3 (pH 13.3):

Resistivity Before Etch (Step 6)
1. 21 ohms
2. 36 ohms
3. 35.6 ohms

Resistivity After Etch (Step 6)
1. 76 ohms
2. 66 ohms
3. 110 ohms

Resistivity After them Clean (Step 7)
1. 218 ohms
2. 113 ohms
3. 182 ohms

EXAMPLES 14–23

Additional Formulations Of Graphite Dispersion

The graphite dispersions having the ingredients set forth in the Example 14–23 Tables are prepared. In the tables, all weights are weights of solids, and carbon composition weights are weights of dry carbon. Each dispersion is prepared and used in the same manner as the previously described formulations for making the walls of through holes conductive. In each case, the walls are made more conductive, thereby enabling the walls to be electroplated.

EXAMPLE 24

Preparation of Carbon Black Dispersion

Colloidal carbon black having an average particle diameter of about 1 micron was combined with deionized water and an organic dispersing agent, forming a dispersion having a viscosity of about 800 cps, a pH of 9.6, and a solids content of 25%. 100 ml of the colloidal carbon black dispersion and 400 ml. of DI water were stirred to make a working bath.

EXAMPLE 25

Preparation of Carbon Black Dispersion

To 500 ml. of the dispersion of Example 24 were added 3 g potassium carbonate, 1 g potassium bicarbonate, 0.1 g. ACYRSOL I-1955 binding agent, 0.4 g. of ACYRSOL I-545 binding agent, and 0.2 g. of FLUORAD FC-120 surfactant.

EXAMPLE 26

Preparation of Carbon Black Dispersion

To 500 ml. of the dispersion of Example 24 were added 3 g potassium carbonate, 1 g potassium bicarbonate, 0.2 g. ACYRSOL I-1955 binding agent, 0.8 g. of ACYRSOL I-545 binding agent, and 0.2 g. of FLUORAD FC-120 surfactant.

EXAMPLE 27

Preparation of Carbon Black Dispersion

Colloidal carbon black having an average particle diameter of about 1 micron was combined with deionized water and an organic dispersing agent, forming 100 ml. of a dispersion having a viscosity of about 800 cps, a pH of 9.6, and a solids content of 25%. Separately, 2 g of sodium carboxymethylcellulose and 400 ml. of DI water were mixed using high speed mixing. The carbon black and carboxymethylcellulose dispersions were mixed to make a working bath.

EXAMPLE 28

Preparation of Carbon Black Dispersion

To 500 ml. of the dispersion of Example 27 were added 3g. of potassium carbonate and 1 g. of potassium bicarbonate, resulting in a pH of 10.9.

EXAMPLE 29

Preparation of Carbon Black Dispersion

To 500 ml of the dispersion of Example 28 were added 0.2g ACYRSOL I-1955 and 0.8 g. ACYRSOL I-545 binding agents.

EXAMPLE 30

Preparation of Carbon Black Dispersion To 500 ml of the dispersion of Example 28 were added 0.4 g. ACRYSOL 8-1955 and 1.6 g. of ACRYSOL I-545 binding agents.

EXAMPLE 31

Preparation of Carbon Black Dispersion 1.5% by volume COLUMBIAN RAVEN 350 carbon black, 1.0% by volume MAPHOS 56 surfactant, and 0.6% by volume potassium hydroxide were added in that order to enough DI water to make up 1 liter, with high speed mixing. The pH of the composition was 13.7.

EXAMPLE 32

Preparation of Carbon Black Dispersion

To one liter of the dispersion of Example 31 were added 2.5 g. of sodium carboxymethylcellulose.

EXAMPLE 33

Preparation of Carbon Black Dispersion

To one liter of the dispersion of Example 32 were added 0.1 g. ACYRSOL I-1955 binding agent and 0.4 g. of ACYRSOL I-545 binding agent.

EXAMPLE 34

Preparation of Carbon Black Dispersion

To one liter of the dispersion of Example 31 were added 0.4 g. ACYRSOL I-1955 binding agent and 0.4 g. of ACYRSOL I-545 binding agent.

EXAMPLE 35

Preparation of Carbon Black Dispersion

A commercially available BLACKHOLE carbon black dispersion is diluted with DI water to 2.5% solids.

EXAMPLE 36

Preparation of Carbon Black Dispersions

To 500 ml of a commercially available BLACKHOLE carbon black dispersion are added 0.1 g. ACRYSOL I-1955 binding agent, 0.4 g. of ACYRSOL I-545 binding agent, and enough DI water to dilute the dispersion to 2.5% solids, forming a first dispersion.

Second, third, and fourth dispersions are made, each having the same active ingredients as the first, but respectively prepared with less water to provide 5% solids, 7.5% solids, and 10% solids.

Additional dispersions are made like the first four, but additionally containing 1.25 g of sodium carboxymethylcellulose per 500 ml. of BLACKHOLE dispersion.

Additional dispersions are made by combining 1.25 g. of sodium carboxymethylcellulose with 500 ml. of BLACKHOLE dispersion and diluting the same to 2.5%, 5%, 7.5%, and 10% solids in separate trials.

These BLACKHOLE dispersions with additives provide conductive through hole coatings with improved adhesion and/or lower resistivity than BLACKHOLE dispersions as sold commercially.

EXAMPLE 37

Preparation of $H_2SO_4$ Fixer

A solution of 4 ml concentrated sulfuric acid per liter of DI water was prepared.

EXAMPLE 38

Preparation of Cleaner/Conditioner 10 g of monoethanolamine, 15 g. of NEODOL 91-8 surfactant, 2 g. of SANDOLEC CF cationic polyamidoamine, and 1 g. of ethylene glycol were mixed with enough DI water to make up one liter. This formulation is a combination of the cleaning and conditioning ingredients disclosed in U.S. Pat. No. 5,139,642, col. 6, ln. 52–63 and col. 16, ln. 14–28.

EXAMPLE 39

Preparation of Conditioner 10 g of monoethanolamine and 5 g. of SANDOLEC CF cationic polyamidoamine were mixed with enough DI water to make up one liter. This formulation is a combination of the ingredients of the conditioner disclosed at col. 16, ln. 23–28 of U.S. Pat. No. 5,139,642.

EXAMPLE 40

First Line Makeup For Carbon Black Process

The carbon black compositions of Examples 24, 25, and 27–30 were used in a dip process in the following order, under the indicated conditions, to improve the conductivity of through holes on double-sided coupons.

1) SHADOW cleaner/conditioner 1, available from Electrochemicals, Inc., Youngstown, Ohio, 5 minutes, at 140° F. (60 ° C.).

2) Rinse—water, 1 minute at room temperature.

3) Carbon black composition, 5 minutes, at room temperature.

4) Drip time, 1 minute at room temperature. 5) Fixer (if any), 45 seconds at 135° F. (57° C.).

6) Dry at 190° F. (88° C.).

7) sodium persulfate microetch (10% in water, 80° F., 27° C.), 30 seconds.

8) Rinse, 20 seconds at room temperature.

9) Dry.

EXAMPLE 41

Second Line Makeup For Carbon Black Process

The compositions of Examples 31, 32, and 34 were used in a dip process in the following order, under the indicated conditions, to improve the conductivity of through holes on double-sided coupons.

1) Working Cleaner/Conditioner from Example 38, 5 minutes, at 130° F. (54° C.).

2) Rinse—DI water, 2 minutes at room temperature.

3) Conditioner from Example 39, 4 minutes, at room temperature.

4) Rinse—same as step 2.

5) Carbon black composition, 4 minutes at room temperature.

6) Fixer (if used).

6) Dry.

7) sodium persulfate microetch, (10% in water, 80° F., 27° C.) 30 seconds.

8) Rinse, 20 seconds at room temperature.

EXAMPLE 42

Third Line Makeup For Carbon Black Process (Double Pass)

The compositions of Examples 31, 32, 33, and 34 were used in a dip process in the following order, under the indicated conditions, to improve the conductivity of through holes on double-sided coupons.

1) Working Cleaner/Conditioner from Example 38, 5 minutes, at 130° F. (54° C.).

2) Rinse, water, 2 minutes at room temperature.

3) Conditioner from Example 39, 4 minutes, at room temperature.

4) Rinse—same as step 2.

5) Carbon black composition, 4 minutes at room temperature.

6) Dry.

7) Carbon black composition, 4 minutes at room temperature.

8) Dry.

EXAMPLE 43

First Line Make-up For Electroplating

In Examples 45–60, coupons were electroplated conventionally by sequentially dipping them in the baths and under the conditions described below.

1) Acid cleaner.

2) Rinse.

3) Microetch, sodium persulfate.

4) Rinse.

5) 10% concentrated sulfuric acid (aqueous).

6) copper bath (45 minutes, 30 amperes per square foot, 2.8 amperes per square meter current, plating to 1 mil (25 micron) thickness.

7) Rinse, DI water.

8) Dry in air.

9) Expose to Thermal shock.

10) cross-section for testing.

The necessary chemicals and more details about plating conditions and test methods suitable for plating copper on a circuit board are commercially available from Electrochemicals, Inc., Youngstown, Ohio.

EXAMPLES 44–59

Through Hole Coating and Electroplating Processes

The carbon black compositions, process chemicals, and protocols of Examples 24–43 were used to coat 2 inch (51 mm.×2 inch (51 mm.) double-sided ("DS") coupons including 20 mil (0.5 mm ) diameter, 0.6 inch (15 mm.) through holes, using a dip process. The resistivities of the coatings were measured before and after microetching. Where indicated, the coupons were then conventionally electroplated as printed wiring boards would be processed, the through holes were sectioned by cutting the boards, and the plated through holes were evaluated for lumpiness, pullaway, and voids under microscopic examination.

The compositions, details of the coating process, resistivities, and plating results are summarized in the table for Examples 44–59 below. Several results are indicated by this experimental work.

First, the carbon black dispersion modified with MAPHOS 56 surfactant and potassium hydroxide, used in Examples 50–56 and prepared in Examples 31–33, provided high resistivity (exceeding 1 kilohm) to the treated through holes, even before microetching. Without additional ingredients (as tested in Examples 50, 51, and 56), the use of the carbon black/MAPHOS 56/KOH formulation of Example 31 resulted in pullaway, lumpiness, or voids. With additives according to the present invention, as in Example 55 (using the formulation of Example 33), this carbon black/

MAPHOS 56/KOH formulation can provide very good plating results, however.

Second, compositions which do not contain sodium carboxymethylcellulose can provide good performance, too. The carbon black/carbonates/ACRYSOL/FLUORAD system of Example 45 gave the best results in these tests.

Third, if an $H_2SO_4$ fixer was used, the carbon black dispersion of Example 24 alone gave very good results and low resistivity (Example 44). Nonetheless, the carbon black dispersion performance (in particular, adhesion, resistivity, or both) can be further improved by adding the carbonate, ACRYSOL, and FLUORAD ingredients (Example 47) or sodium carboxymethylcellulose (Examples 46–47).

EXAMPLE 60

Carbon Black/Graphite Mixtures

The graphite experiments of Examples 4–23 are repeated, substituting an equal weight of the carbon black of Example 24 for 10% by weight of the graphite of the respective examples 4–23. The results demonstrate the utility of each composition for coating through holes to lower their resistivity, enabling them to be electroplated.

EXAMPLE 61

Carbon Black/Graphite Mixtures

The carbon black experiments of Examples 24–59 are repeated, substituting an equal weight of the graphite of Example 8 for 90% by weight of the carbon black of the respective examples 24–59. The results demonstrate the utility of each composition for coating through holes to lower their resistivity, enabling them to be electroplated. The electroplated through holes pass a solder shock test.

| | Example (By Weight) | | | |
|---|---|---|---|---|
| Ingredient | 14 | 15 | 16 | 17 |
| SHOWA DENKO ULTRAFINE | 5.00 | 5.50 | — | — |
| ASBURY MICRO 440 | — | — | 5.45 | — |
| AQUADAGE E | — | — | — | 4.50 |
| Na Carboxymethylcellulose | 0.20 | 0.39 | 0.25 | — |
| $K_2CO_3$ | 1.007 | 1.00 | — | — |
| $KHCO_3$ | 0.57 | 0.50 | — | — |
| TRITON X-100 | — | — | — | 0.38 |
| MAPHOS 56 | 0.40 | 0.25 | — | — |
| fumed silica | — | — | — | 0.57 |
| 2-ethylhexanol | — | — | — | 0.03 |
| ANTIFOAM A | trace | — | — | — |
| Deionized water | 92.90 | 92.31 | 93.80 | 94.52 |

| | Example (By Weight) | | |
|---|---|---|---|
| Ingredient | 18 | 19 | 20 |
| AQUADAGE E | 2.00 | — | — |
| GRAPHITE 850 | — | 3.00 | — |
| GRAFO 1204B | — | — | 4.40 |
| GRAPHOKOTE 90 | — | — | 1.25 |
| ACRYSOL I-545 | — | — | 0.03 |
| ACRYSOL I-1955 | — | 0.50 | 0.01 |
| Na Carboxymethylcellulose | — | 0.20 | 0.39 |
| $K_2CO_3$ | 1.00 | 1.00 | 1.00 |
| $KHCO_3$ | 0.50 | 1.00 | 1.00 |
| FLUORAD FC-120 | — | 0.40 | 0.25 |
| 2-ethylhexanol | 0.03 | — | — |
| ANTIFOAM A | trace | — | — |
| Deionized water | 96.47 | 93.90 | 91.67 |

| | Example (By Weight) | | |
|---|---|---|---|
| Ingredient | 21 | 22 | 23 |
| GRAFO 1204B | 4.25 | — | — |
| GRAPHOKOTE 90 | — | 2.00 | — |
| GRAPHITE 450 | — | — | 2.75 |
| ACRYSOL I-545 | 0.08 | — | .04 |
| ACRYSOL I-1955 | 0.01 | — | — |
| TAMOL 819 | 0.03 | — | — |
| Na Carboxymethylcellulose | 0.5 | — | — |
| $K_2CO_3$ | 0.6 | — | — |
| $KHCO_3$ | 0.1 | — | — |
| TRITON X-100 | — | 0.38 | 0.38 |
| MAPHOS 56 | 0.25 | — | — |
| FLUORAD FC-120 | 0.1 | — | — |
| fumed silica | — | 0.57 | 0.01 |
| Al Silicate | — | — | 0.56 |
| 2-ethylhexanol | — | 0.03 | .02 |
| Deionized water | 94.07 | 97.02 | 96.24 |

| Ex. | Additions to Carbon Black Dispersion | Details of Coating Process | Resistivity Before/After Microetch (Ohms) | Qualitative Plating Results |
|---|---|---|---|---|
| 44 | None (Ex. 24) | Dip; Single Pass (Ex. 40); $H_2SO_4$ Fixer (Ex. 37) | 18 ohms before 68 ohms after | Very Good |
| 45 | $K_2CO_3$ $KHCO_3$ ACRYSOL FLUORAD (Ex. 25) | Dip; Single Pass (Ex. 40); $H_2SO_4$ Fixer (Ex. 37) | 30 ohms before 43 ohms after | Very Good (better adhesion than Ex. 44) |
| 46 | CMC (Ex. 27) | Dip; Single Pass (Ex. 40); $H_2SO_4$ Fixer (Ex. 37) | 16 ohms before 52 ohms after | Slight Pullaway |
| 47 | CMC $K_2CO_3$ $KHCO_3$ (Ex. 28) | Dip; Single Pass (Ex. 40); $H_2SO_4$ Fixer (Ex. 37) | 23 ohms before 60 ohms after | Good; No Pullaway |
| 48 | CMC $K_2CO_3$ $KHCO_3$ ACRYSOL (Ex. 29) | Dip; Single Pass (Ex. 40); $H_2SO_4$ Fixer (Ex. 37) | 19 ohms before 72 ohms after | Good; No Pullaway |
| 49 | CMC $K_2CO_3$ $KHCO_3$ ACRYSOL (Ex. 30) | Dip; Single Pass (Ex. 40); $H_2SO_4$ Fixer (Ex. 37) | 32 ohms before 93 ohms after | Good; No Pullaway |
| 50 | MAPHOS 56 KOH (Ex. 31) | Dip; Single Pass (Ex. 41); $H_2SO_4$ Fixer (Ex. 37) | 7000 ohms before 20,000 ohms after | Voids |
| 51 | MAPHOS 56 KOH (Ex. 31) | Dip Single Pass (Ex. 41); No Fixer | 1600 ohms before 2500 ohms after | Good Plating; Pullaway |
| 52 | MAPHOS 56 KOH CMC (Ex. 32) | Dip; Single Pass (Ex. 41); $H_2SO_4$ Fixer (Ex. 37) | 1800 ohms before 2500 ohms after | Good Plating; Pullaway |
| 53 | MAPHOS 56 KOH CMC (Ex. 32) | Dip Single Pass (Ex. 41); No Fixer | 2200 ohms before 7300 ohms after | Good Plating; Slight Pullaway |
| 54 | MAPHOS 56 KOH CMC | Dip; Double Pass (Ex. 42); | 1200 ohms before 3000 ohms | Slight Pullaway |

-continued

| | | | | |
|---|---|---|---|---|
| | (Ex. 32) | No Fixer | after | |
| 55 | MAPHOS 56 | Dip; | 3000 ohms | Very Good |
| | KOH | Double Pass | before | Plating; |
| | CMC | (Ex. 42); | 4300 ohms | No Pullaway |
| | ACRYSOL | No Fixer | after | |
| | (Ex. 33) | | | |
| 56 | MAPHOS 56 | Dip; | 1800 ohms | Good |
| | KOH | Double Pass | before | Plating; |
| | (Ex. 31) | (Ex. 42); | 5400 ohms | Pullaway; |
| | | No Fixer | after | Lumpiness |
| 57 | ACRYSOL | Dip: | 2600 ohms | Voids; |
| | (Ex. 34) | Single Pass | before | Pullaway |
| | | (Ex. 41); | 500,000 ohms | |
| | | $H_2SO_4$ | after | |
| | | Fixer (Ex. 37) | | |
| 58 | ACRYSOL | Dip; | 5000 ohms | Pullaway; |
| | (Ex. 34) | Single Pass | before | Voids |
| | | (Ex. 41); | 90,000 ohms | |
| | | No Fixer | after | |
| 59 | ACRYSOL | Dip; | 1700 ohms | Good |
| | (Ex. 34) | Double Pass | before | Plating; |
| | | (Ex. 42); | 300,000 ohms | Slight |
| | | No Fixer | after | Pullaway; |
| | | | | No Voids |

What is claimed is:

1. A method of applying a conductive graphite coating to a non-conductive layer, comprising the steps of:

A. providing a board comprising at least first and second electrically conductive metal layers seperated by a non-conductive layer, said board having a recess extending through at least one of said metal layers into said nonconductive layer, said recess having a non-conductive surface;

B. providing a liquid dispersion comprising electrically conductive synthetic graphite having a mean particle size no greater than about 50 microns, present in an amount effective to provide an electrically conductive coating when said composition is applied to said non-conductive surface of said recess; and C. applying said graphite dispersing to said non-conductive surface of said recess to form a substantially continuous, electrically conductive graphite coating thereon, wherein said graphite coating has an electrical resistivity of less than about 1000 ohms.

2. A method of applying a conductive graphite coating to a non-conductive layer, comprising the steps of:

A. providing a board comprising at least first and second electrically conductive metal layers separated by a non-conductive layer, said board having a recess extending through at least one of said metal layers into said non-conductive layer, said recess having a non-conductive surface;

B. providing a liquid dispersion of from about 1% to about 7% by weight of electrically conductive graphite having a mean particle size no greater than about 50 microns, present in an amount effective to provide an electrically conductive coating when said composition is applied to said non-conductive surface of said recess; and C. applying said graphite dispersion to said non-conductive surface of said recess to form a substantially continuous, electrically conductive graphite coating thereon, wherein said graphite coating has an electrical resistivity of less than about 1000 ohms.

3. The method of claim 2, wherein said graphite is present as from greater than about 4% to about 6.5% by weight of said graphite dispersion.

4. A method of applying a conductive graphite coating to a non-conductive layer, comprising the steps of:

A. providing a board comprising at least first and second electrically conductive metal layers separated by a non-conductive layer, said board having a recess extending through at least one of said metal layers into said non-conductive layer, said recess having a non-conductive surface;

B. applying from about 0.01% to about 10% by weight of a water dispersible organic binding agent in an aqueous dispersing medium to said non-conductive surface;

C. providing a liquid dispersion of electrically conductive graphite having a mean particle size no greater than about 50 microns, present in an amount effective to provide an electrically conductive coating when said composition is applied to said non-conductive surface of said recess; and D. applying said graphite dispersion to said non-conductive surface of said recess to form a substantially continuous, electrically conductive graphite coating thereon, wherein said graphite coating has an electrical resistivity of less than about 1000 ohms.

5. The method of claim 4, wherein said graphite dispersion further comprises said water dispersible organic binding agent, present in an amount effective to bind said graphite particles to said non-conductive surface.

6. The method of claim 5, wherein said graphite dispersion comprises from about 0.5% to about 10% by weight of said graphite and from about 0.01% to about 10% by weight of said water dispersible organic binding agent.

7. The method of claim 5, wherein said graphite dispersion further comprises a surfactant, present in an amount effective to wet a through hole.

8. The method of claim 7, wherein said graphite dispersion further comprises an anionic dispersing agent, present in an amount effective for dispersing said graphite.

9. The method of claim 8, wherein said graphite dispersion further comprises a buffer, provided in an amount effective to maintain a pH of the graphite dispersion between about 9 and about 11.

10. The method of claim 8, wherein said graphite dispersion comprises:

A. from about 0.1% to about 20% by weight of said graphite;

B. from about 0.2% to about 15% by weight of said organic binding agent;

C. from about 0.01% to about 10% by weight of said anionic dispersing agent; and D. from about 0.01% to about 10% by weight of said surfactant.

11. The method of claim 8, wherein said graphite dispersion comprises:

A. from about 0.5% to about 10% by weight of said graphite;

B. from about 0.2% to about 10% by weight of said organic binding agent;

C. from about 0.01% to about 5% by weight of said anionic dispersing agent; and

D. from about 0.02% to about 3% by weight of said surfactant.

12. The method of claim 8, wherein said graphite dispersion comprises:

A. from about 1% to about 7% by weight of said graphite;

B. from about 0.5% to about 6% by weight of said organic binding agent;

C. from about 0.1% to about 2% by weight of said anionic dispersing agent; and

D. from about 0.05% to about 1% by weight of said surfactant.

13. The method of claim 8, wherein said graphite dispersion comprises:
   A. from greater than about 4% to about 6.5% by weight of said graphite;
   B. from about 1.5% to about 3% by weight of said organic binding agent;
   C. from about 0.1% to about 2% by weight of said anionic dispersing agent; and
   D. from about 0.05% to about 1% by weight of said surfactant.

14. The method of claim 5, wherein said organic binding agent is present as from about 0.2% to about 15% by weight of the graphite dispersion.

15. The method of claim 5, wherein said organic binding agent is present as from about 0.5% to about 10% by weight of the graphite dispersion.

16. The method of claim 5, wherein said organic binding agent is present as from about 1.5% to about 6% by weight of the graphite dispersion.

17. The method of claim 4, wherein said organic binding agent is an alkali metal carboxymethylcellulose.

18. A method of applying a conductive graphite coating to a non-conductive layer, comprising the steps of:
   A. providing a board comprising at least first and second electrically conductive metal layers separated by a non-conductive layer, said board having a recess extending through at least one of said metal layers into said nonconductive layer, said recess having a non-conductive surface;
   B. providing a liquid dispersion comprising electrically conductive graphite having a mean particle size no greater than about 50 microns, present in an amount effective to provide an electrically conductive coating when said composition is applied to said non-conductive surface of said recess, and an anionic dispersing agent, present in an amount effective for dispersing said graphite; and
   C. applying said graphite dispersion to said non-conductive surface of said recess to form a substantially continuous, electrically conductive graphite coating thereon, wherein said graphite coating has an electrical resistivity of less than about 1000 ohms.

19. The method of claim 18, wherein said anionic dispersing agent is an acrylic emulsion.

20. The method of claim 18, wherein said anionic dispersing agent has a molecular weight of less than 1000.

21. The method of claim 18, wherein said anionic dispersing agent is present as from about 0.01% to about 10% by weight of the graphite dispersion.

22. The method of claim 21, wherein said graphite dispersion comprises from about 0.5% to about 10% by weight graphite.

23. The method of claim 18, wherein said anionic dispersing agent is present as from about 0.1% to about 5% by weight of the graphite dispersion.

24. A method of applying a conductive graphite coating to a non-conductive layer, comprising the steps of:
   A. providing a board comprising at least first and second electrically conductive metal layers separated by a non-conductive layer, said board having a recess extending through at least one of said metal layers into said nonconductive layer, said recess having a non-conductive surface;
   B. providing a liquid dispersion comprising electrically conductive graphite having a mean particle size no greater than about 50 microns, present in an amount effective to provide an electrically conductive coating when said composition is applied to said non-conductive surface of said recess, and a surfactant, present in an amount effective to wet a through hole; and
   C. applying said graphite dispersion to said non-conductive surface of said recess to form a substantially continuous, electrically conductive graphite coating thereon, wherein said graphite coating has an electrical resistivity of less than about 1000 ohms.

25. The method of claim 24, wherein said surfactant is an anionic surfactant.

26. The method of claim 24, wherein said surfactant is an anionic fluorochemical surfactant.

27. The method of claim 24, wherein said surfactant is present as from about 0.01% to about 10% by weight of the graphite dispersion.

28. The method of claim 27, wherein said graphite dispersion comprises from about 0.5% to about 10% by weight of said graphite.

29. The method of claim 24, wherein said surfactant is present as from about 0.02% to about 3% by weight of the graphite dispersion.

30. The method of claim 24, wherein said surfactant is present as from about 0.05% to about 1% by weight of the graphite dispersion.

31. A method of applying a conductive graphite coating to a non-conductive layer, comprising the steps of:
   A. providing a board comprising at least first and second electrically conductive metal layers separated by a non-conductive layer, said board having a recess extending through at least one of said metal layers into said nonconductive layer, said recess having a non-conductive surface;
   B. providing a liquid dispersion comprising electrically conductive graphite having a mean particle size no greater than about 50 microns, present in an amount effective to provide an electrically conductive coating when said composition is applied to said non-conductive surface of said recess, and a buffer, provided in an amount effective to maintain a pH of the graphite dispersion between about 9 and about 11; and
   C. applying said graphite dispersion to said non-conductive surface of said recess to form a substantially continuous, electrically conductive graphite coating thereon, wherein said graphite coating has an electrical resistivity of less than about 1000 ohms.

32. The method of claim 31, wherein said graphite dispersion comprises from about 0.5% to about 10% by weight of said graphite.

33. The method of claim 31, wherein said buffer is a carbonate-bicarbonate buffer.

34. A method of applying a conductive graphite coating to a non-conductive layer, comprising the steps of:
   A. providing a board comprising at least first and second electrically conductive metal layers separated by a non-conductive layer, said board having a recess extending through at least one of said metal layers into said nonconductive layer, said recess having a non-conductive surface;

B. providing a liquid dispersion of electrically conductive graphite having a mean particle size no greater than about 50 microns, present in an amount effective to provide an electrically conductive coating when said composition is applied to said non-conductive surface of said recess, wherein said graphite dispersion has a pH within a range of from about 9 to about 11; and C. applying said graphite dispersion to said non-conductive surface of said recess to form a substantially continuous, electrically conductive graphite coating thereon, wherein said graphite coating has an electrically resistivity of less than about 1000 ohms.

* * * * *